(12) United States Patent
Kim

(10) Patent No.: US 8,354,752 B2
(45) Date of Patent: Jan. 15, 2013

(54) SEMICONDUCTOR DEVICES

(75) Inventor: Sun-Young Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/215,857

(22) Filed: Aug. 23, 2011

(65) Prior Publication Data

US 2011/0303963 A1 Dec. 15, 2011

Related U.S. Application Data

(62) Division of application No. 12/292,819, filed on Nov. 26, 2008, now Pat. No. 8,008,185.

(30) Foreign Application Priority Data

Nov. 27, 2007 (KR) .......................... 10-2007-0121455

(51) Int. Cl.
*H01L 23/48* (2006.01)

(52) U.S. Cl. ........ 257/776; 257/314; 257/377; 257/774; 257/E23.145

(58) Field of Classification Search .......... 257/314–326, 257/377, 774, 776, E23.143, E23.145
See application file for complete search history.

(56) References Cited

U.S. PATENT DOCUMENTS

| 6,953,963 | B2 | 10/2005 | Wang et al. | |
|---|---|---|---|---|
| 7,061,040 | B2 | 6/2006 | Shih | |
| 2005/0104232 | A1* | 5/2005 | Shih ............................. | 257/905 |
| 2008/0153298 | A1* | 6/2008 | Hui et al. ..................... | 438/703 |

FOREIGN PATENT DOCUMENTS

KR 10-2007-0059324 A 6/2007

* cited by examiner

*Primary Examiner* — Thanhha Pham
(74) *Attorney, Agent, or Firm* — Lee & Morse, P.C.

(57) ABSTRACT

A method of forming a semiconductor device includes forming line patterns on a substrate, the line patterns defining narrow and wide gap regions, forming spacer patterns in the narrow and wide gap regions on sidewalls of the line patterns, spacer patterns in the wide gap regions exposing an upper surface of the substrate, and spacer patterns in the narrow gap regions contacting each other to fill the narrow gap regions, forming an insulating interlayer to cover the spacer patterns and the line patterns, forming at least one opening through the insulating interlayer, the opening including at least one contact hole selectively exposing the upper surface of the substrate in the wide gap region, the contact hole being formed by using the spacer patterns in the narrow gap region as an etching mask, and forming a conductive pattern to fill the opening.

8 Claims, 25 Drawing Sheets

SEMICONDUCTOR DEVICES

CROSS REFERENCE TO RELATED APPLICATION

This is a divisional application based on application Ser. No. 12/292,819, filed Nov. 26, 2008 now U.S. Pat. No. 8,008,185, the entire contents of which is hereby incorporated by reference.

BACKGROUND OF THE INVENTION

1. Field of the Invention

Example embodiments relate to semiconductor devices and methods of forming the same. More particularly, example embodiments relate to a semiconductor device including a self aligned plug and a method of forming the same.

2. Description of the Related Art

A conventional semiconductor device, e.g., a MOS transistor, may include a gate electrode with impurity regions formed on both sides of the gate electrode, so the impurity regions on both sides of the gate electrode may be used as source and drain electrodes, respectively. Voltages may be applied, e.g., independently, to the gate electrode, the source electrode, and the drain electrode via contact plugs to operate the semiconductor device.

As semiconductor devices become more highly integrated, however, it becomes difficult to form contact plugs for the gate, source and drain electrodes. In particular, the conventional contact plugs may be formed in respective contact holes, which may be patterned by using a photolithography to have a predetermined cross section. A reduced size of the semiconductor devices, however, may cause the patterned contact holes to have a modified predetermined cross-section, e.g., due to an optical proximity effect, thereby reducing a cross sectional area of the contact holes. A reduced cross sectional area of the contact holes may cause non-uniform deposition of metal therein, so a resultant contact plug may not completely fill the contact hole, and/or may increase resistance of the contact plugs therein, thereby reducing operability and reliability of the transistor.

SUMMARY OF THE INVENTION

Example embodiments are therefore directed to a semiconductor device and a method of manufacturing the same, which substantially overcome one or more of the disadvantages of the related art.

It is therefore a feature of an example embodiment to provide a semiconductor device with a self aligned plug.

It is another feature of an example embodiment to provide a method of forming a semiconductor device with a self aligned plug.

At least one of the above and other features and advantages may be realized by providing a method of forming a semiconductor device, including forming line patterns on a substrate along a first direction, the line patterns defining narrow gap regions along the first direction and wide gap regions along the first direction, forming spacer patterns in the narrow and wide gap regions on sidewalls of the line patterns, spacer patterns facing one another in the wide gap regions being formed to be spaced apart from each other to expose an upper surface of the substrate, and spacer patterns facing one another in the narrow gap regions being formed to contact each other to fill the narrow gap regions, forming an insulating interlayer to cover the spacer patterns and the line patterns, forming at least one opening along a second direction through the insulating interlayer, the opening including at least one contact hole selectively exposing the upper surface of the substrate in the wide gap region, the contact hole being formed by using the spacer patterns in the narrow gap region as an etching mask, and forming a conductive pattern to fill the opening.

The opening may be formed to have a continuous line shape along the second direction, the second direction being perpendicular to the first direction. The conductive pattern may be formed to include a contact plug in contact with the substrate in the wide gap region via the at least one contact hole, the conductive pattern being separated from the substrate by the spacer patterns in the narrow gap regions. The conductive pattern may include forming a conductive layer to completely fill the opening and the at least one contact hole, the opening and the at least one contact hole being filled simultaneously, and etching the conductive layer to expose an upper surface of the insulation interlayer to form the conductive pattern, the conductive pattern defining a continuous line shaped interconnection pattern on a contact plug. Forming the conductive pattern may include forming a first conductive layer to fill the opening and the at least one contact hole, the opening and the at least one contact hole being filled simultaneously, etching the first conductive layer to expose a portion of an upper sidewall of the opening to form a first conductive pattern, the first conductive pattern defining a continuous line shaped interconnection pattern on a contact plug, forming a second conductive layer on the first conductive pattern to completely fill the opening, the second conductive layer being formed to have a lower resistivity than that of the first conductive layer, and etching the second conductive layer to expose an upper surface of the insulating interlayer to form a second conductive pattern, the second conductive layer being connected to the first conductive pattern.

The substrate may be formed to be a semiconductor substrate with device isolation layers defining active regions, and the line patterns may be formed to be gate patterns defining source and drain regions in the narrow and wide gap regions, respectively. The gate pattern may be a gate structure of a nonvolatile memory transistor including a floating gate electrode, a gate interlayer pattern and a control gate electrode which are sequentially stacked. Forming the conductive pattern may include forming a conductive layer filling the opening, and forming source and bit line contact plugs filling the contact hole and source and bit lines on the source and bit line contact plugs by etching back the conductive layer, cross sections of the source and bit line contact plugs in a plane parallel to a contact plane between the gate patterns and the substrate being rectangular and having continuous line shaped structures. Before forming the insulating interlayer, the method may further include forming a common source line connecting the source regions. Forming the common source line may include removing device isolation patterns adjacent to the source regions to expose portions of the semiconductor substrate between the gate patterns adjacent to the source regions, and implanting impurities into the source regions and portions of the exposed semiconductor substrate. The gate pattern may further include a hard mask pattern, the hard mask pattern being used as an etching mask while the insulating interlayer is patterned to prevent an exposure of a control gate electrode by the opening.

The spacer patterns may be formed of a material having an etching selectivity with respect to the insulation interlayer. The insulation interlayer may include a silicon oxide layer, and the spacer patterns may include a silicon nitride layer or a silicon oxynitride layer. The method may further include forming device isolation patterns on the substrate to define active regions along the second direction, forming the line patterns to cross the active regions, the line patterns being gate patterns, and the wide gap regions being wider than the narrow gap regions as measured along the second direction, forming the spacer patterns to expose the active regions in the wide gap regions, forming the at least one opening through the insulating interlayer to expose the active region in the wide gap region, and forming the conductive pattern in the opening, the conductive pattern including a contact plug contacting the active region through the contact hole in the wide gap region and an interconnection pattern extending continuously along the second direction, the interconnection pattern and the contact plug being integral to each other. The interconnection pattern and the contact plug may be formed in a same process step of a substantially same material.

At least one of the above and other features and advantages may be realized by providing a semiconductor device, including line patterns on a substrate along a first direction, the line patterns defining narrow gap regions along the first direction and wide gap regions along the first direction, spacer patterns in the narrow and wide gap regions on sidewalls of the line patterns, spacer patterns facing one another in the wide gap regions being spaced apart from each other to expose an upper surface of the substrate, and spacer patterns facing one another in the narrow gap regions contacting each other to fill the narrow gap regions, an insulating interlayer covering the spacer patterns and the line patterns, at least one opening along a second direction through the insulating interlayer, the opening including at least one contact hole selectively exposing the upper surface of the substrate in the wide gap region, and a conductive pattern in the opening and the at least one contact hole to define an interconnection pattern on a contact plug.

The interconnection pattern and the contact plug may be integral to each other. The gate pattern may be a gate structure of a non volatile memory transistor including a floating gate electrode, a gate insulating interlayer pattern and a control gate electrode which are sequentially stacked. The spacer pattern may be interposed between the interconnection pattern and the active region in the narrow gap region, the spacer pattern electrically separating the interconnection pattern and the active region from each other in the narrow gap region. A cross section of the contact plug in a plane parallel to a contact plane between the line patterns and the substrate may have a rectangular shape.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
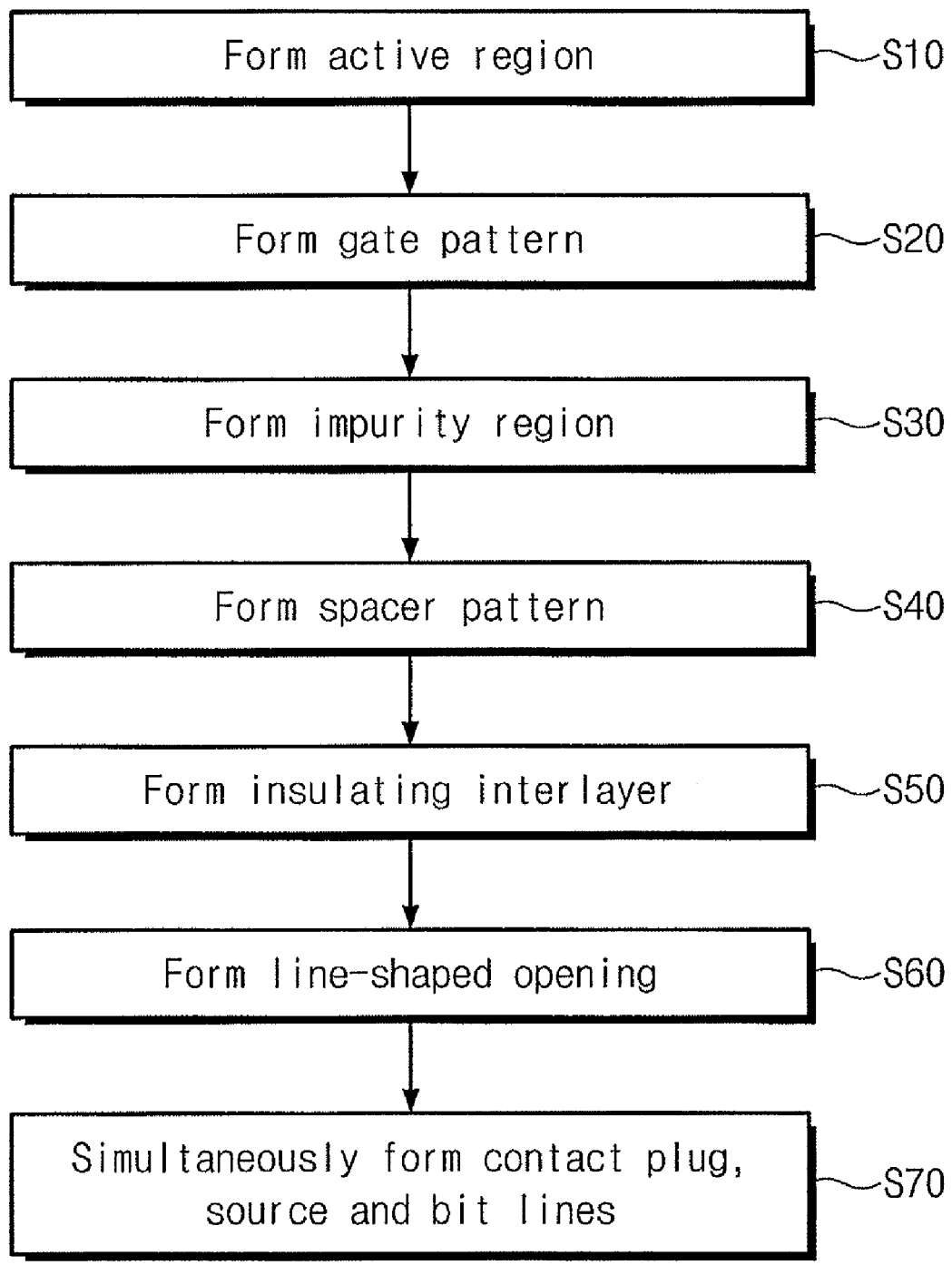
FIG. 1 illustrates a process flow chart of a method of forming a semiconductor device according to an example embodiment.

Korean Patent Application No. 10-2007-0121455, filed on Nov. 27, 2007, in the Korean Intellectual Property Office, and entitled: "Semiconductor Devices and Methods of Forming the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of:" For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

FIG. 1 illustrates a process flow chart of a method of forming a semiconductor device according to an example embodiment. FIGS. 2-6 labeled with (A) illustrate top plan views of sequential stages in a method of forming a semiconductor device according to an example embodiment. FIGS. 2-6 labeled with (B), (C), (D) and (E) illustrate cross sectional views along lines I-I', II-II', III-III', and IV-IV', respectively, of respective FIGS. 2A, 3A, 4A, 5A and 6A. It is noted that FIGS. 2A-6E illustrate cross-sectional view of a NOR flash memory device. However, other semiconductor devices, e.g., a semiconductor device having metal lines and via-plugs connecting the metal lines, a transistor structure, and so forth, may be manufactured according to example embodiments.

A semiconductor device according to an example embodiment may include device isolation layer patterns 110 defining active regions ACT on a semiconductor substrate 100, gate patterns 130 on the semiconductor substrate 100 crossing the active regions ACT, spacer patterns 150 on sidewalls of the gate patterns 130, and conductive patterns 195 including interconnection patterns and contact plugs integral to each other. The interconnection patterns may extend to cross the gate patterns 130, and may be positioned on the contact plugs, which may connect the interconnection patterns to the active regions ACT.

Figure 2A:
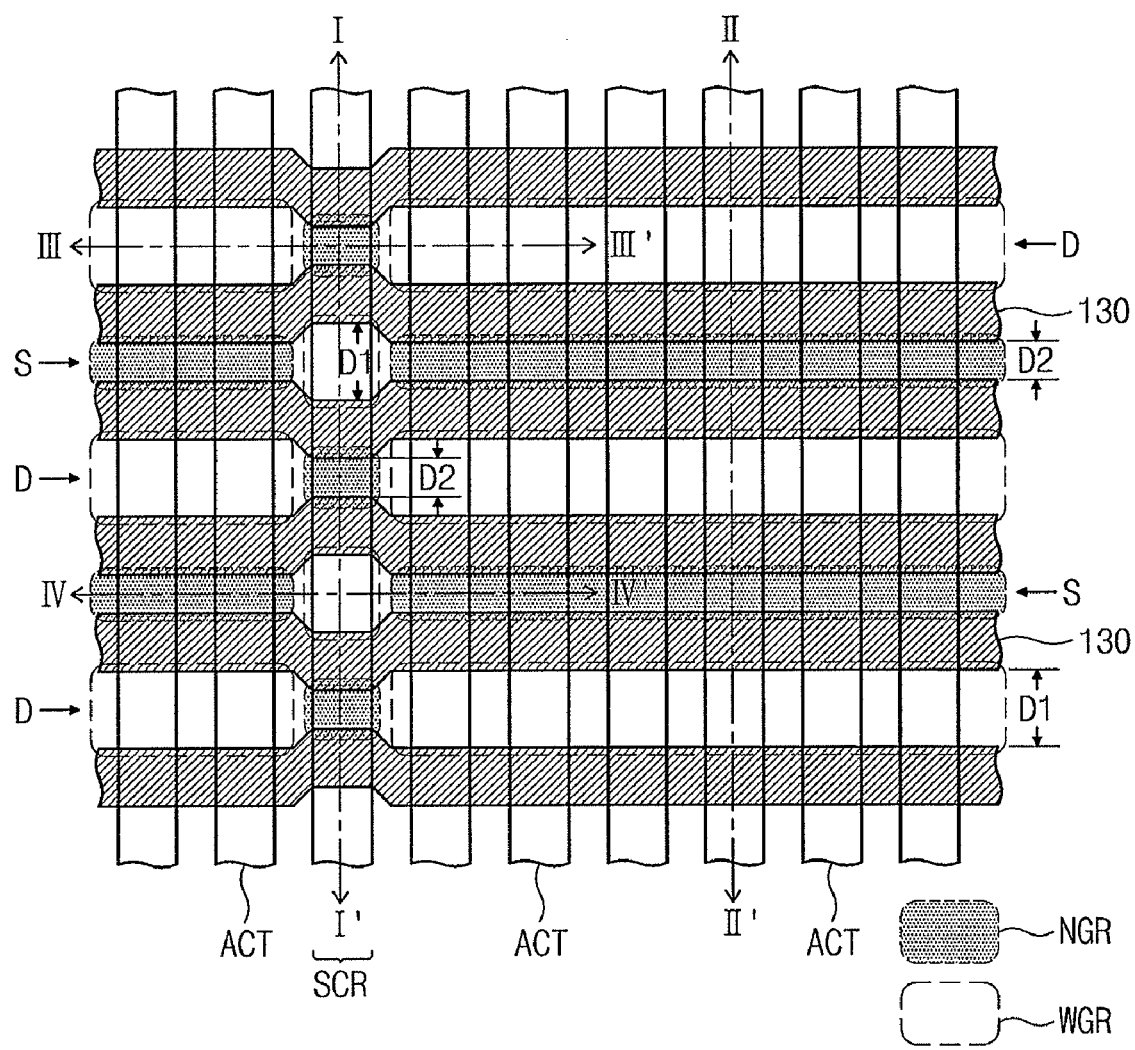
FIGS. 2A, 3A, 4A, 5A and 6A illustrate top plan views of sequential stages in a method of forming a semiconductor device according to an example embodiment.

Referring to FIGS. 1 and 2A-2E, the device isolation layer patterns 110 may be formed in parallel to each other in operation S10, e.g., using a shallow trench isolation technique, to define the active regions ACT, e.g., the active regions ACT may be parallel to each other, on the semiconductor substrate 100. The active regions ACT may extend along a first direction, e.g., along the y-axis, as illustrated in FIG. 2A. A gate insulating layer 120 may be formed on the semiconductor substrate 100. The gate insulating layer 120 may be formed using, e.g., a thermal oxidation process or a chemical vapor deposition (CVD) process before or after forming the device isolation layer pattern 110.

Figure 2B:
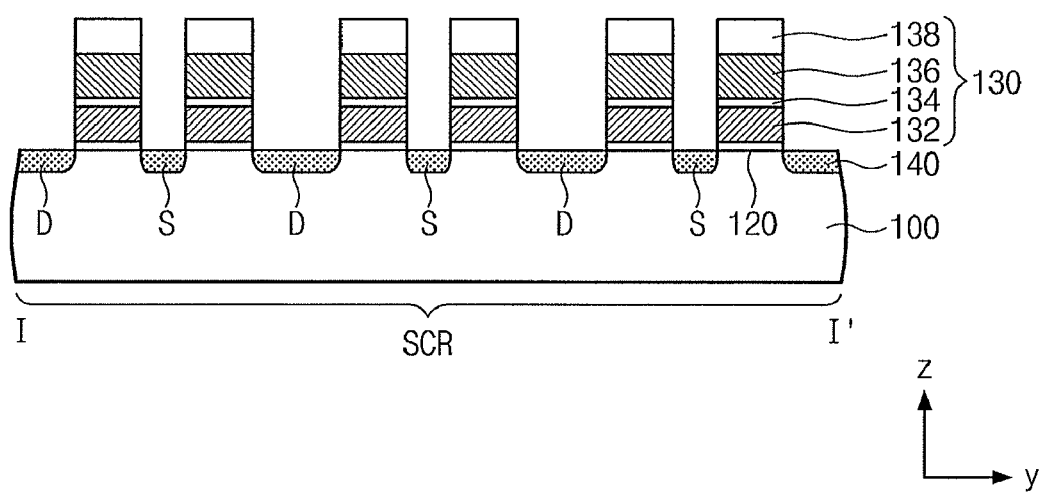
FIGS. 2B, 3B, 4B, 5B, and 6B illustrate cross sectional views along line I-I' in FIGS. 2A, 3A, 4A, 5A and 6A, respectively.
Figure 2C:
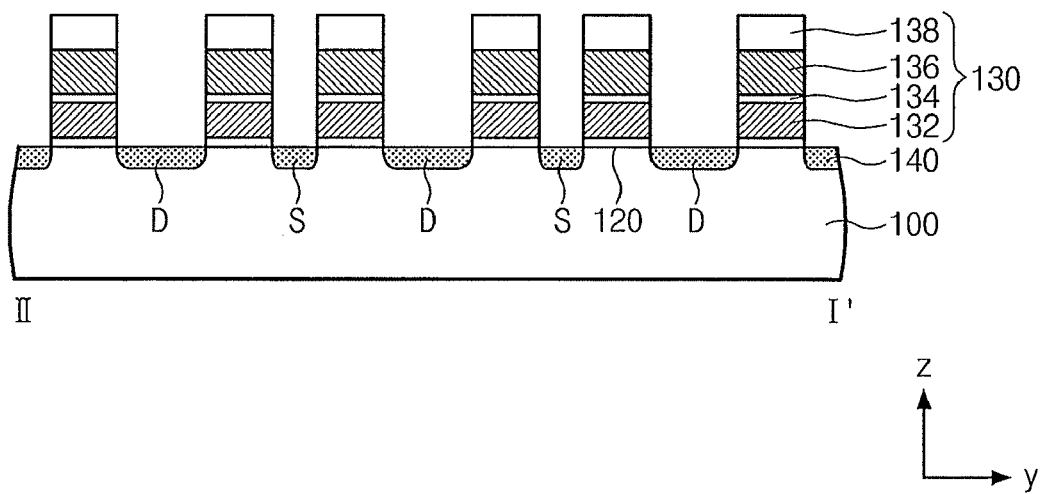
FIGS. 2C, 3C, 4C, 5C, and 6C illustrate cross sectional views along line II-II' of FIGS. 2A, 3A, 4A, 5A and 6A, respectively.
Figure 2D:
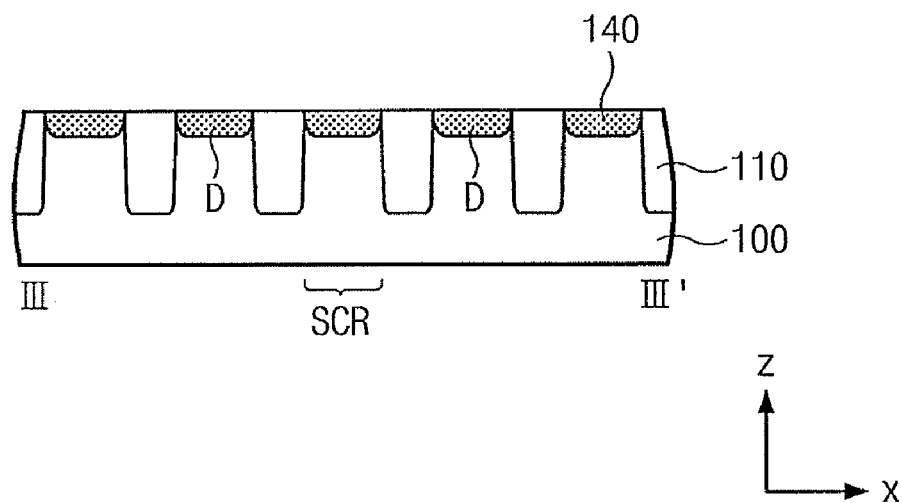
FIGS. 2D, 3D, 4D, 5D, and 6D illustrate cross sectional views along line III-III' of FIGS. 2A, 3A, 4A, 5A and 6A, respectively.
Figure 2E:
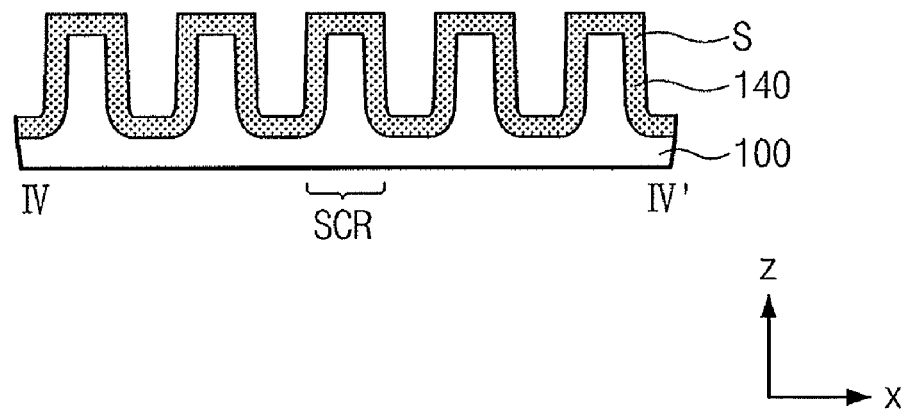
FIGS. 2E, 3E, 4E, 5E, and 6E illustrate cross sectional views along line IV-IV' of FIGS. 2A, 3A, 4A, 5A and 6A, respectively.

Next, in operation S20 illustrated in FIG. 1, the gate patterns 130 may be sequentially stacked on the gate insulating layer 120, as illustrated in FIGS. 2B-2C. The gate patterns 130, as illustrated in FIG. 1A, may extend along a second direction, e.g., along the x-axis. The first and second direction may cross each other, so the active regions ACT and the gate patterns 130 may cross each other. The active region ACT may include a channel region under the gate pattern 130. The gate patterns 130 may be used as gate electrodes, e.g., in a MOS transistor.

As illustrated in FIGS. 2B-2C, each gate pattern 130 may include a floating gate electrode 132, a gate insulating interlayer pattern 134, and a control gate electrode 136. The control gate electrode 136 may be disposed to cross the active regions ACT, and may function as a word line. The floating gate electrode 132 may be electrically separated from adjacent conductive patterns to function as a charge storage layer, and may be formed to have a sidewall exposing an upper surface of the device isolation layer patterns 110.

Alternatively, the gate pattern 130 may be a gate structure of a nonvolatile memory device of a floating trap type (not shown). In this case, the gate pattern 130 may include a charge storage layer having trap sites. The charge storage layer having the trap sites may be an insulating layer including one or more of a silicon nitride layer, a silicon oxynitride layer, and nano dot.

Each gate pattern 130 may further include a hard mask pattern 138 on the control gate electrode 136. The hard mask pattern 138 may be used as an etching mask in a patterning process for forming the gate pattern 130. The hard mask pattern 138 may function as an etch stop layer preventing the control gate electrode 136 from being exposed in a subsequent process for forming an opening (180 in FIG. 4A). The hard mask pattern 138 may be formed of a material having an etching selectivity with respect to the floating electrode 132, the control gate electrode 136, and a subsequently formed insulating interlayer (170 of FIG. 3B).

The gate patterns 130 may be positioned on the semiconductor substrate 100 to define narrow gap regions NGR and wide gap regions WGR, as illustrated in FIG. 2A. More specifically, distances between adjacent gate patterns 130 along the first direction, e.g., along the y-axis, may be non-uniform, i.e., may include first distance D1 and second distance D2 smaller than the first distance D1, as illustrated in FIG. 2A. The different distances D1 and D2 may define the wide and narrow regions WGR and NGR, respectively. In other words, narrow gap regions NGR may be regions where a distance between two adjacent gate patterns 130 is narrow, i.e., the second distance D2, and the wide gap regions WGR may be regions where a distance between two adjacent gate patterns 130 is wide, i.e., the first distance D1. For example, as illustrated in FIG. 2A, the gate patterns 130 may be positioned to have an alternating pattern of narrow and wide gap regions NGR and WGR, i.e., a narrow gap region NGR may extend along the second direction, e.g., along the x-axis, between two adjacent wide gap regions WGR.

Next, in operation S30 illustrated in FIG. 1, impurity regions 140 may be formed in the narrow and wide gap regions NGR and WGR using the gate patterns 130 as an ion mask, e.g., an impurity region 140 may formed on each side of each gate pattern 130. The impurity regions 140 may define source and drain electrodes S and D, respectively, in the narrow and wide gap regions NGR and WGR. The source and drain electrodes S and D may be opposite each other, so the channel in the active region ACT under the gate pattern 130 may be between the source and drain electrodes S and D. The wide gap region WGR may include the drain electrodes D and a first portion of a source contact region SCR. The narrow gap region NGR may include the source electrodes S and a second portion of the source contact region SCR, i.e., the second portion of the source contact region SCR may be different than the first portion of the source contact region SCR. For example, the source electrodes S may be narrower along the first direction than the drain electrodes D, as illustrated in FIGS. 2B-2C.

It is noted that since FIGS. 2A-6E illustrate a portion of a NOR flash memory device, each memory cell of a cell array region in the NOR flash memory device may include a bit line plug connected to each drain electrode D, so each of the memory cells may be accessed individually. Further, the source electrodes S may be connected to each other via a common source line, i.e., extending in the source contact region SCR along the first direction, so voltage may be applied to the source electrodes S via a common source plug formed in the source contact region SCR.

It is further noted that the source contact region SCR, as illustrated in FIG. 2A, may be between active regions ACT, and may extend along the first direction to include the source plug to connect the source electrodes S. Since the source electrodes S are electrically connected to each other through the common source line, the common source line may be formed using a self aligned source process. The self aligned source process may include removing a portion of the device isolation layer pattern 110 between adjacent gate patterns 130, i.e., a region intended for forming the source electrode S, to expose an upper surface of the semiconductor substrate 100. Ion implantation process may be performed on the exposed upper surface of the semiconductor substrate 100 to implant impurities therein, i.e., of the same conductivity as the source electrodes S, to form a diffused region electrically connecting the source electrodes S to each other. In other words, the source electrodes S may be connected to each other through the diffused region. Other methods of electrically connecting the source electrodes S to each other are within the scope of the present invention.

Referring to FIGS. 1 and 3A-3E, spacer patterns 150 may be formed on sidewalls of the gate patterns 130 in operation S40. For example, a spacer layer (not shown) may be formed conformally on the gate patterns 130 to cover sidewalls and upper surfaces of the gate patterns 130 and the source contact region SCR region, followed by anisotropic etching of the spacer layer to expose upper surfaces of the gate patterns 130 to form the spacer patterns 150 on sidewalls thereof. The term "conformally" corresponds to a layer formed with a uniform thickness or substantially uniform thickness along a profile of an underlying layer or structure.

Figure 3A:
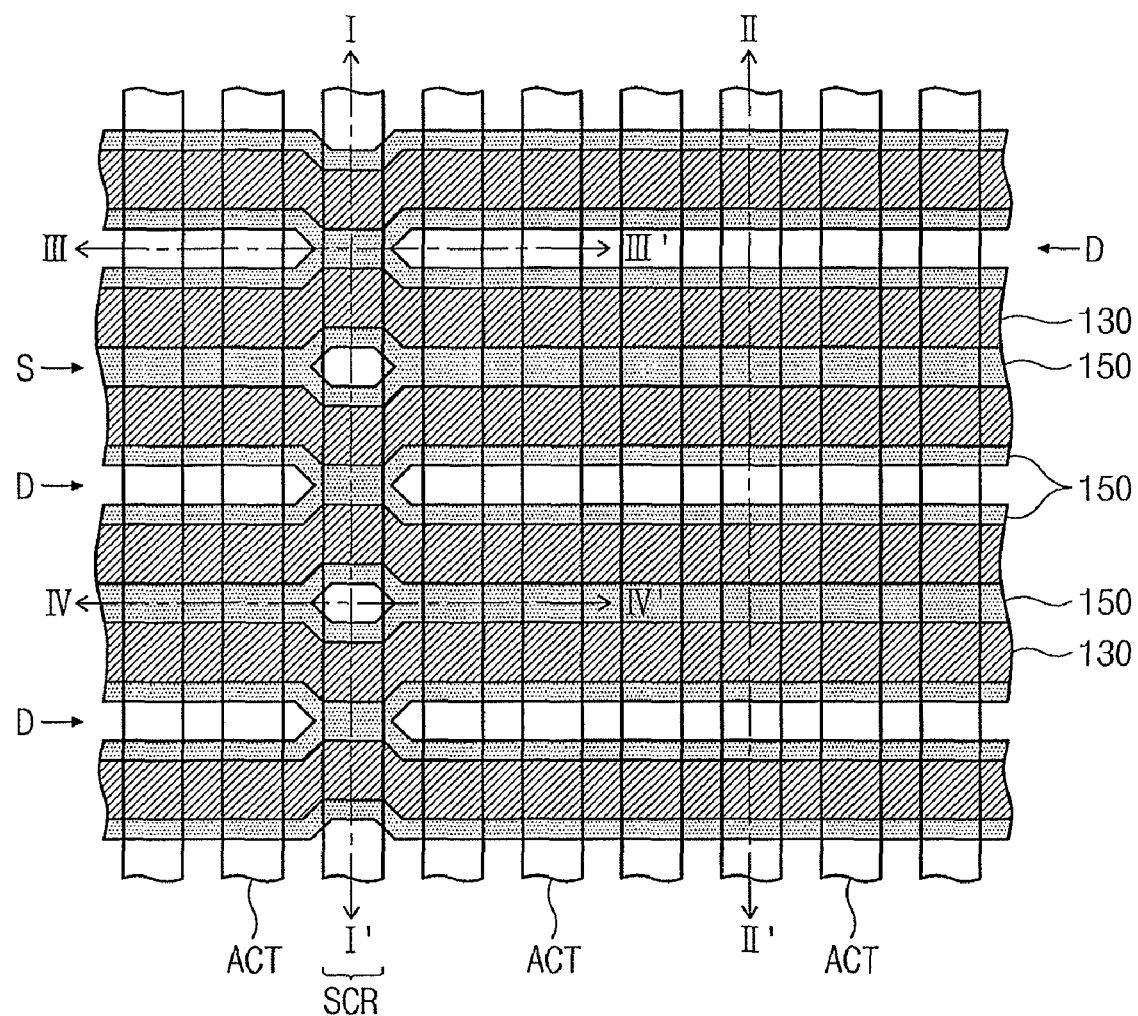
Figure 3B:
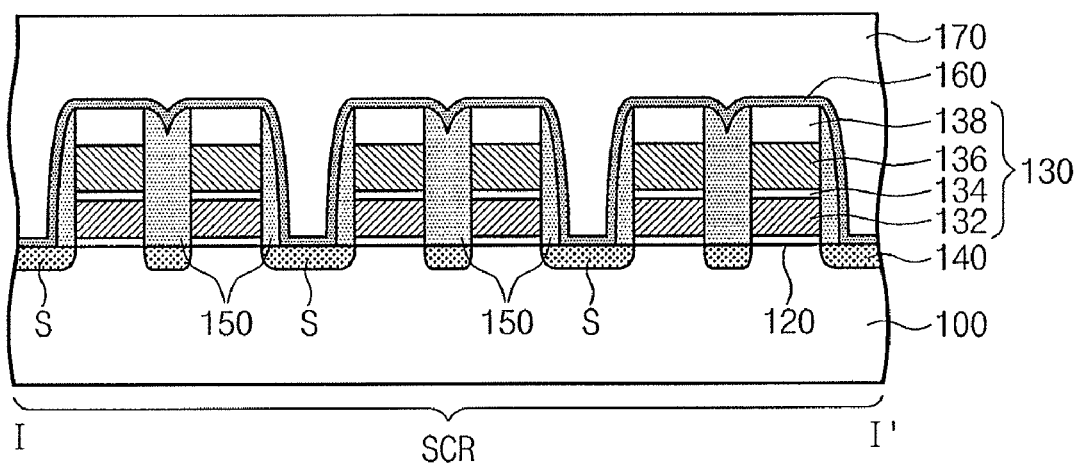
Figure 3C:
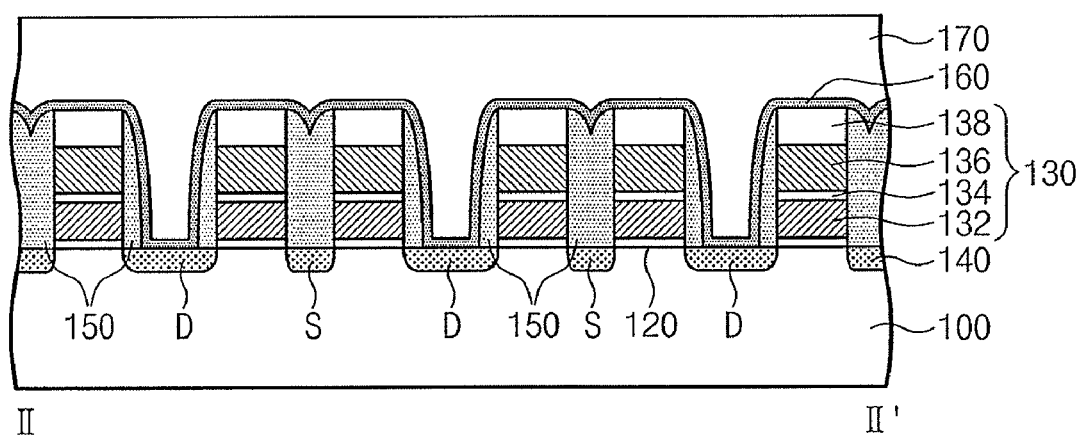
Figure 3D:
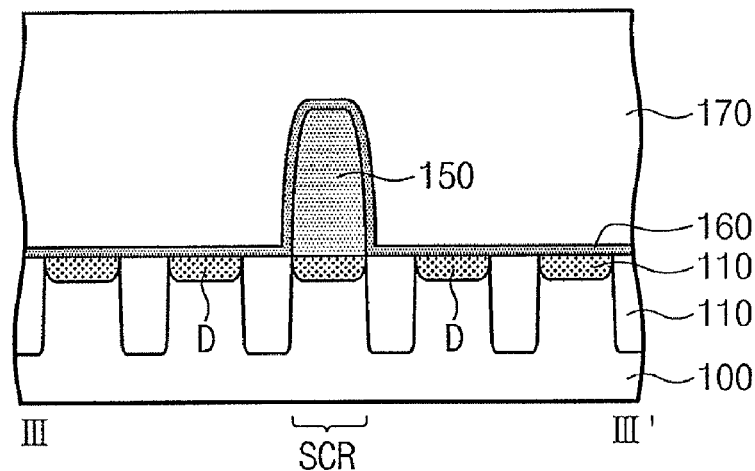
Figure 3E:
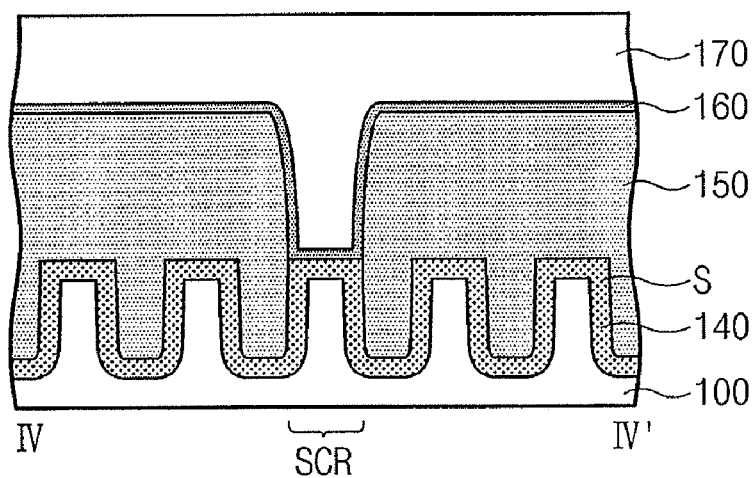

For example, the spacer layer may have a thickness greater than half the second distance D2. Accordingly, when spacer patterns 150 are formed on sidewalls of the gate patterns 130, a narrow gap region NGR, i.e., a regions having a width of the second distance D2, between two adjacent gate patterns 130 may be filled with the spacer patterns 150, as illustrated in FIGS. 3A-3C. For example, as illustrated in FIG. 3C, spacer patterns 150 on adjacent gate patterns 130, i.e., adjacent gate patterns 130 having the narrow gap region NGR therebetween, and facing each other may contact each other to completely cover i.e., overlap, a respective source electrode S, i.e., in the narrow gap region NGR. As further illustrated in FIG. 3C, spacer patterns 150 on adjacent gate patterns 130, i.e., adjacent gate patterns 130 having the wide gap region WGR therebetween, and facing each other may be spaced apart from each other to expose an upper surface of a drain electrode D therebetween. It is noted that in the source contact region SCR, the spacer layer may be formed to have a thickness of at least half the first distance D1 of the wide gap region WGR to completely cover the drain electrodes D, while the source electrodes S may be wider than the drain electrodes D and may be exposed to facilitate electrical connection therebetween in the source contact region SCR, as illustrated in FIG. 3B.

Next, i.e., in operation S50, an insulating interlayer 170 may be formed to cover an entire resultant structure on the semiconductor substrate 100. The insulating interlayer 170 may be formed of a material having an etching selectivity with respect to the spacer pattern 150 and the hard mask pattern 138. For example, the insulating interlayer 170 may include at least one silicon oxide layer, and each of the spacer patterns 150 and the hard mask pattern 138 may include silicon nitride and/or silicon oxynitride. The insulating interlayer 170 may be formed to have a height, i.e., a distance as measured from an upper surface of the semiconductor substrate 100 in an upward direction along the z-axis, greater than a height of the gate patterns 130. The insulating interlayer 170 may be planarized to have a substantially planar top surface, e.g., via a chemical mechanical polishing (CMP) technique.

For example, the insulating interlayer 170 may be formed directly on the gate patterns 130 and on an upper surface of the semiconductor substrate 100. In another example, as illustrated in FIGS. 3B-3C, an etch stop layer 160 may be formed conformally on the gate patterns 130, so the etch stop layer 160 may be between the insulating interlayer 170 and the gate patterns 130. In other words, the etch stop layer 160 may cover the spacer patterns 150, upper surfaces of the gate patterns 130, and, e.g., portions of the drain electrodes D, so the insulating interlayer 170 may be formed on the etch stop layer 160. The etch stop layer 160 may be formed of any suitable material having an etching selectivity with respect to the insulating interlayer 170, e.g., silicon nitride. Each of the spacer patterns 150 and the hard mask pattern 138 may be formed of one or more of a silicon oxide layer, a silicon nitride layer, and a silicon oxynitride layer.

Figure 4A:
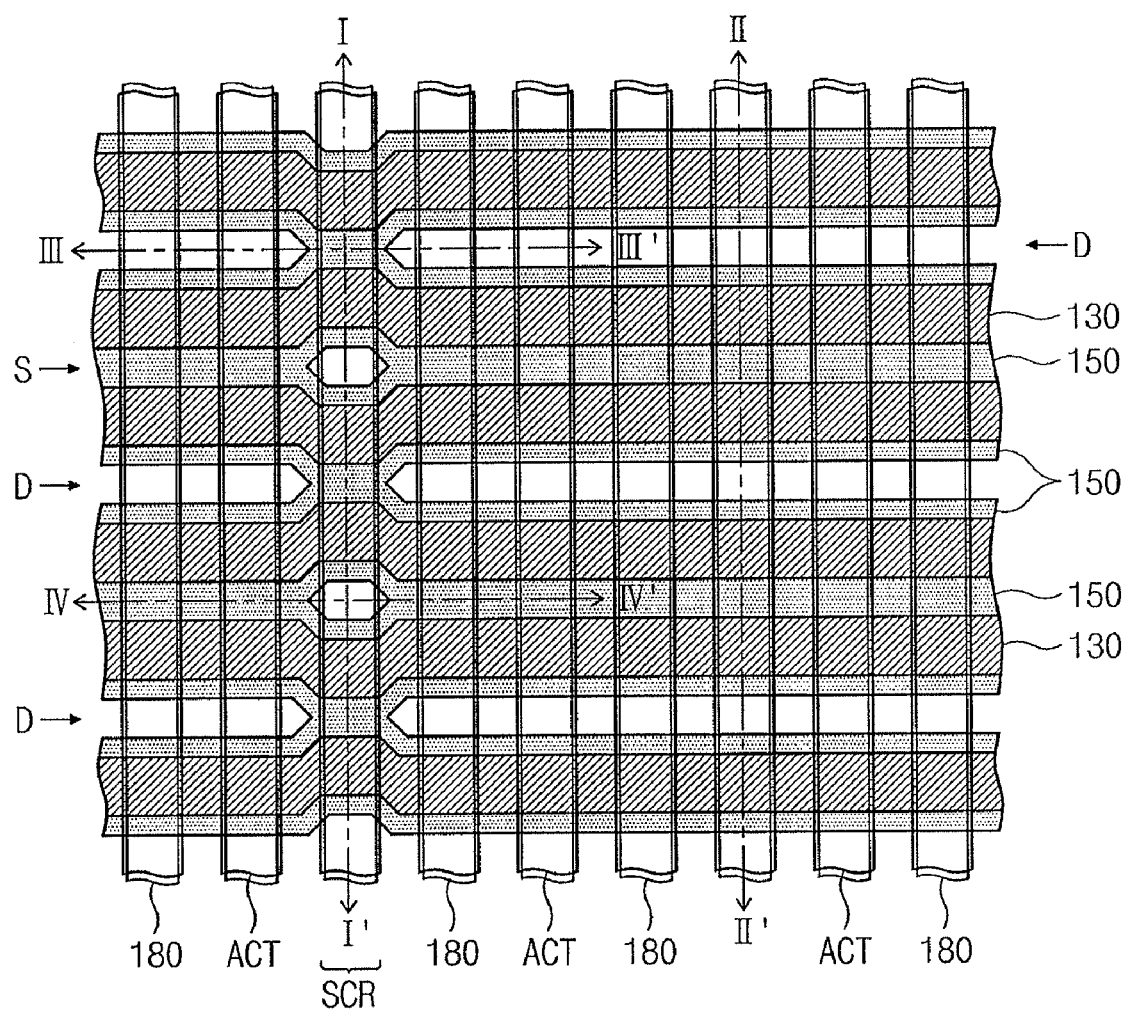
Figure 4B:
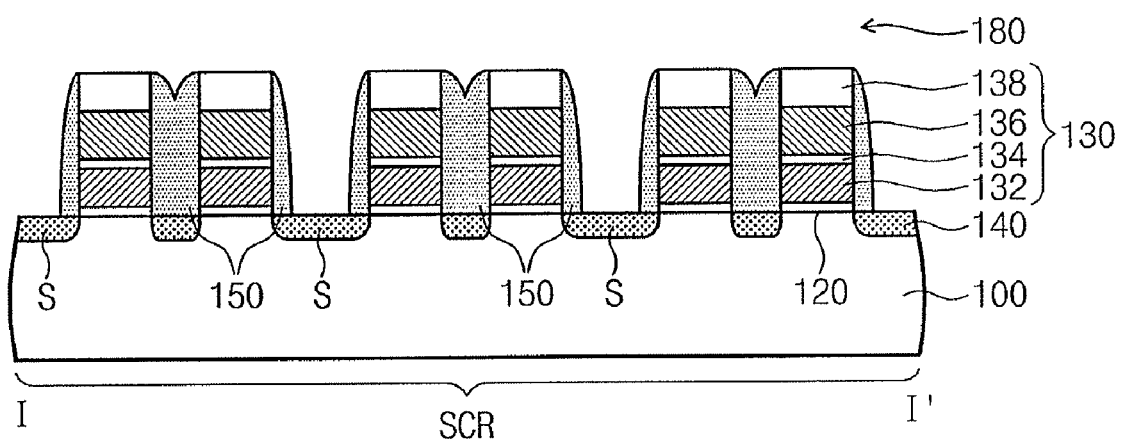
Figure 4C:
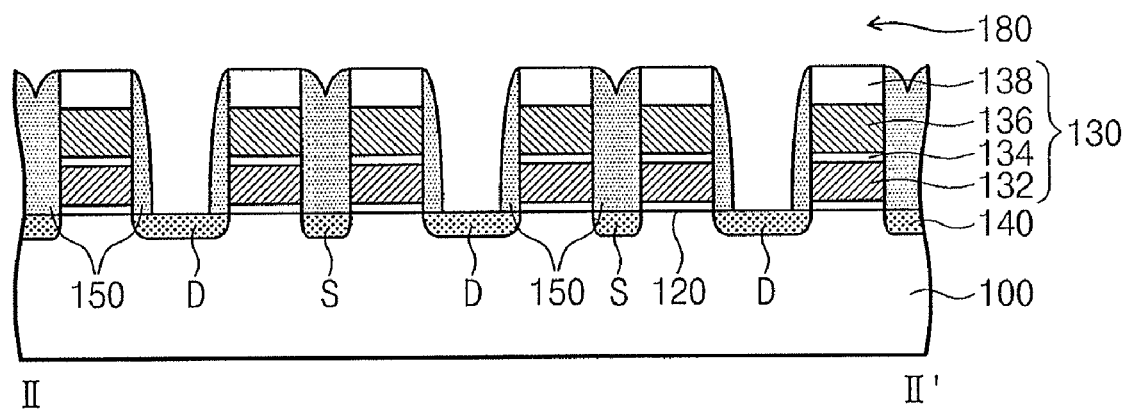

Referring to FIGS. 1 and 4A-4D, the insulating interlayer 170 and the etch stop layer 160 may be patterned to form openings 180 along the first direction to cross the gate patterns 130, i.e., operation S60. For example, portions of the insulating interlayer 170 and the etch stop layer 160 in the active regions ACT along the first direction may be completely removed to form the openings 180, e.g., linearly shaped. Each of the openings 180 may have a line shape extending continuously along the first direction, i.e., along the y-axis. For example, each of the openings 180 may include a linear horizontal opening extending continuously along the first direction and having a rectangular cross section in the xy-plane, as illustrated in FIG. 4A, and may include vertical holes extending from the linear horizontal opening along the z-axis toward exposed impurity regions 140, as illustrated in FIG. 4C. Since the openings 180 may be formed on the active regions ACT, the openings 180 and the active regions ACT may overlap each other on a plane arrangement, as illustrated in FIG. 4A.

Figure 4D:
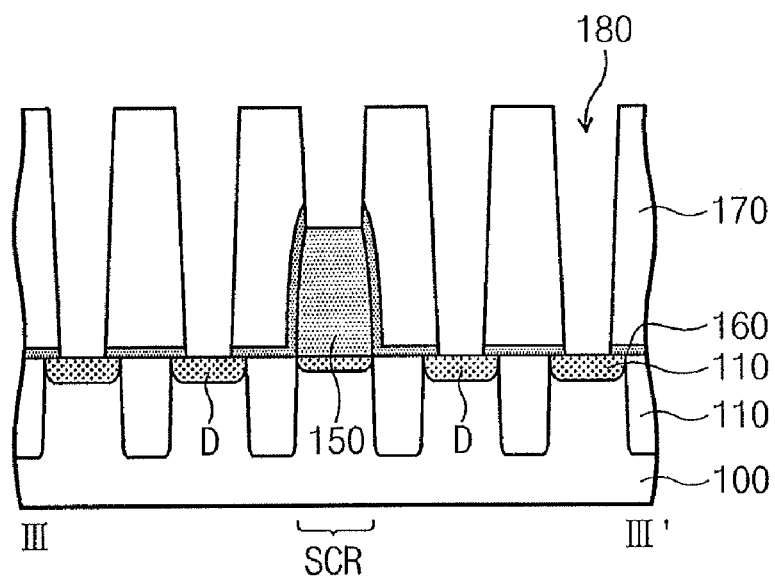
Figure 4E:
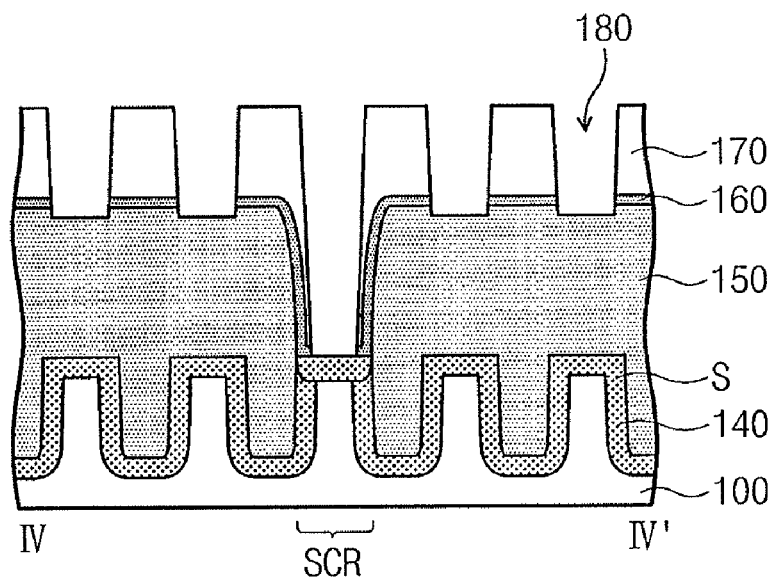

The openings 180 may be spaced apart from each other along the second direction, i.e., a portion of the insulation interlayer 170 may be positioned between adjacent openings 180, and the openings 180 may be parallel to each other, as illustrated in FIGS. 4A and 4D. As illustrated in FIGS. 4D-4E, since portions of the insulating interlayer 170 and the etch stop layer 160 may remain between adjacent active regions ACT, e.g., on device isolation layers 110 between impurity regions 140, an opening 180 between adjacent remaining portions of the insulating interlayer 170 may be above a corresponding impurity region 140, e.g., expose an upper surface of a drain electrode D.

The openings 180 may be formed as follows. A first etching solution may be used to etch the insulating interlayer 170, such that the etch stop layer 160 may be exposed. Next, a second etching solution may be used to etch the etch stop layer 160, such that the impurity regions 140 may be exposed. The first etching solution may have an etching selectivity with respect to the etching stop layer 160, and the second etching solution may have an etching selectivity with respect to the semiconductor substrate 100 and the spacer patterns 150.

Using the first and second etching solutions having the above described etching selectivity may form the openings 180 only above the drain electrodes D, so the source electrodes S may remain covered with the spacer patterns 150. More specifically, since the second etching solution may have an etching selectivity with respect to the spacer patterns 150, the spacer patterns 150 may remain in the narrow gap region NGR to cover the impurity regions 140 therein, as illustrated in FIG. 4C. Therefore, source electrodes S formed in the impurity regions 140 in the narrow gap region NGR may not be exposed during formation of the openings 180. That is, as illustrated in FIG. 4C, the spacer patterns 150 may be interposed between the openings 180 and the impurity regions 140 in the narrow gap region NGR, i.e., source electrodes S, so the spacer patterns 150 may separate the openings 180 and the source electrodes S in the narrow gap region NGR. It is noted, as described previously, that covering/exposing the source/drain electrodes S/D in the source contact region SCR region may be reversed. As a result, the source electrodes S may not be exposed inside the memory cells by the openings 180, as illustrated in FIG. 4C, but may be exposed only inside the source contact region SCR by the openings 180, as illustrated in FIG. 4E.

Since the etch stop layer 160 and the insulating interlayer 170 may be sequentially formed on impurity regions 140 in the in the wide gap region WGR, i.e., the wide gap region WGR may not be fully filled with the spacer patterns 150, the impurity regions 140 in the in the wide gap region WGR, e.g., drain electrodes D, may be exposed during formation of the openings 180. Spacer patterns 150 overlapping the drain electrodes D, as illustrated in FIG. 4C, may define sidewalls of the openings 180 in the wide gap region WGR. As a result, the drain electrodes D may not be exposed inside of the source contact region SCR by the openings 180, as illustrated in FIG. 4D, but may be exposed only inside of the memory cells by the openings 180, as illustrated in FIG. 4C.

Figure 5A:
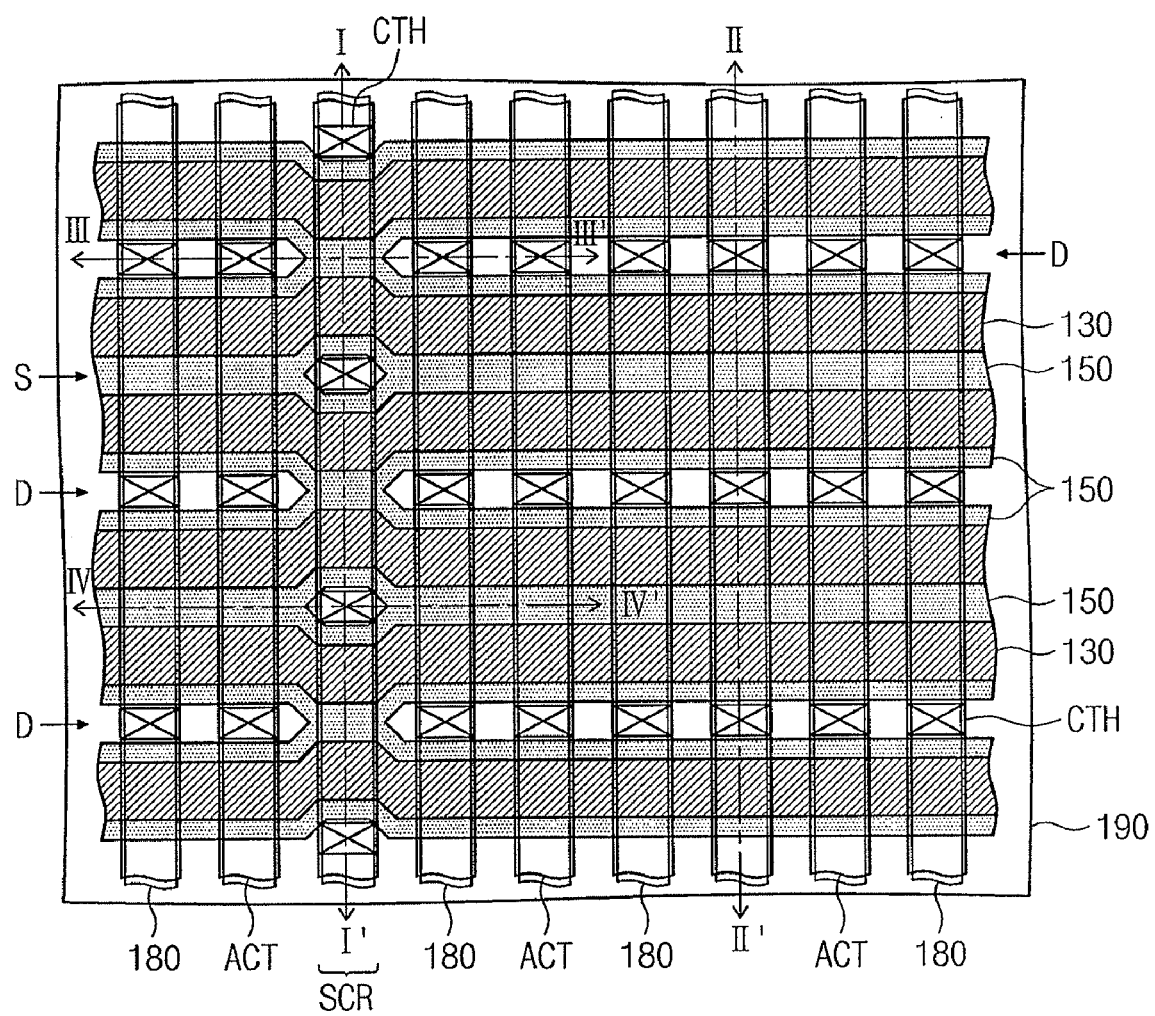
Figure 5B:
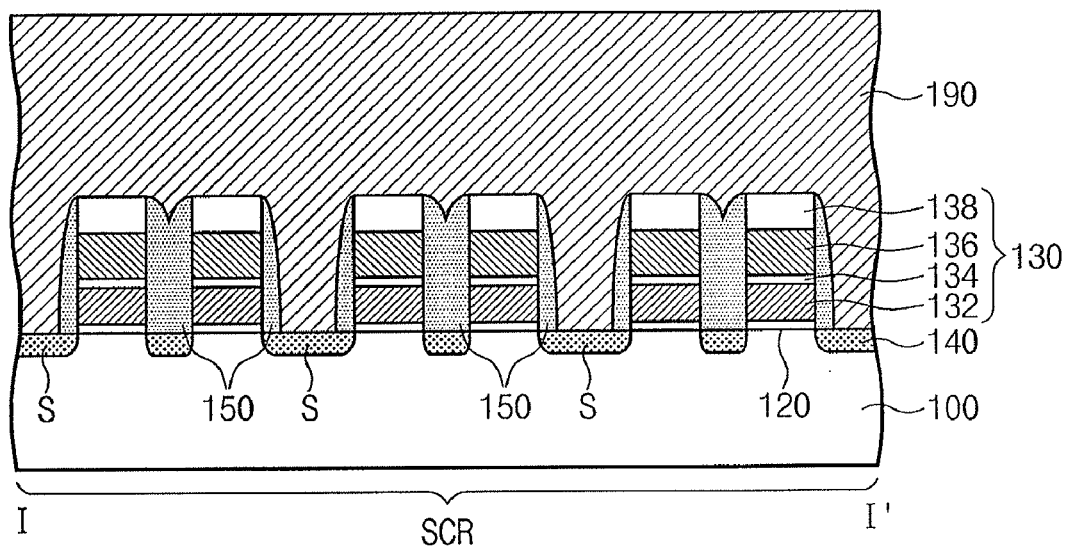

Referring to FIGS. 1 and 5A-5E, a first conductive layer 190 may be formed on the insulating interlayer 170 to fill the openings 180. More specifically, the first conductive layer 190 may fill, e.g., simultaneously in a single process step, both the vertical and horizontal openings, e.g., may completely and uniformly fill the openings 180, so portions of the first conductive layer 190 in the vertical openings may contact exposed impurity regions 140. Vertical opening of the openings 180, i.e., contact holes, filled with the first conductive layer 190 are illustrated in FIG. 5A as CTH contact holes. It is noted that the contact holes CTH may selectively expose the impurity regions 140 of the wide gap region WGR, and may be easily formed without using an additional contact hole patterning process. The first conductive layer 190 may include one or more of polysilicon, titanium, titanium nitride, tungsten, tungsten nitride, aluminum, copper, and so forth.

Figure 5C:
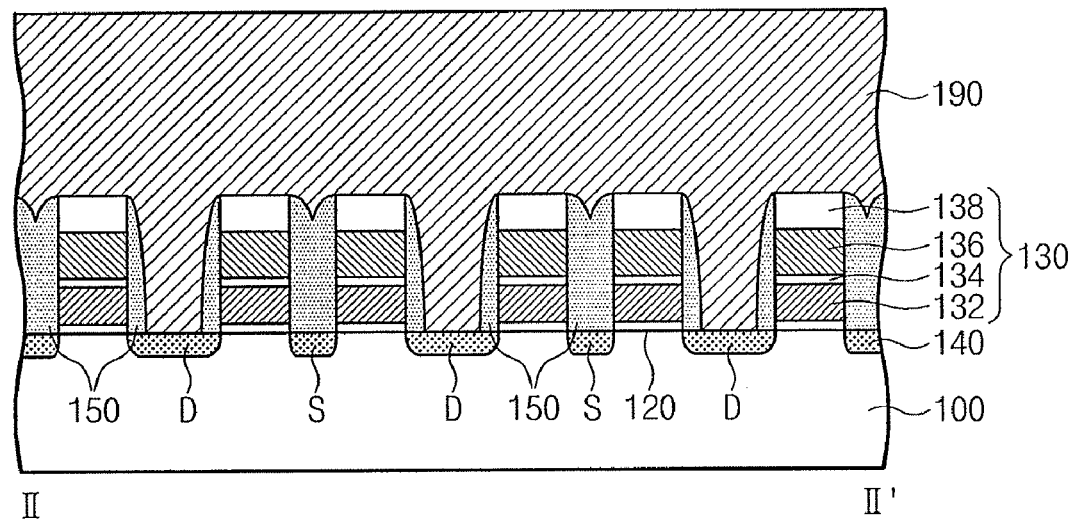
Figure 5D:
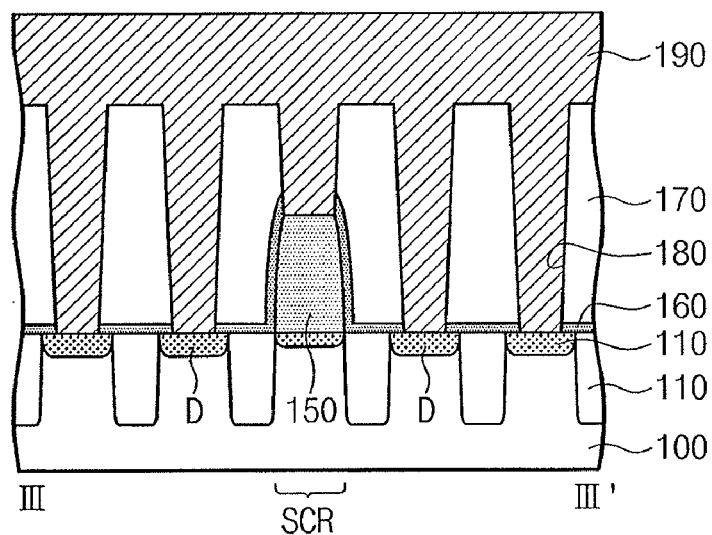
Figure 5E:
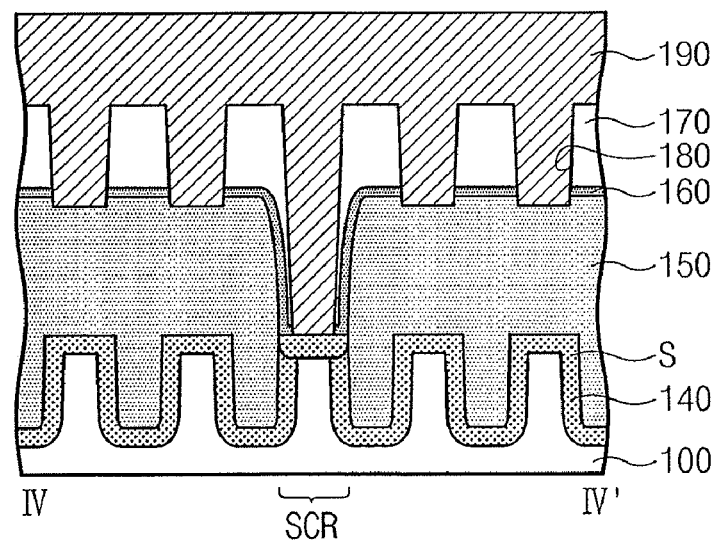

Since the impurity regions 140 may not be exposed in the narrow gap region NGR due to the spacer patterns 150, as discussed previously with reference to FIGS. 4A-4D, the first conductive layer 190 may be electrically separated from the impurity regions 140 of the narrow gap region NGR. In other words, the first conductive layer 190 may be electrically separated from the source electrodes S of the memory cells, as illustrated in FIG. 5C. Further, the first conductive layer 190 may be separated from the common source line, as illustrated in FIG. 5E, and from the drain region D in the source contact region SCR, as illustrated in FIG. 5D. As illustrated in FIGS. 5C-5D, the first conductive layer 190 may be electrically connected to drain regions D in the wide gap region WGR.

Figure 6A:
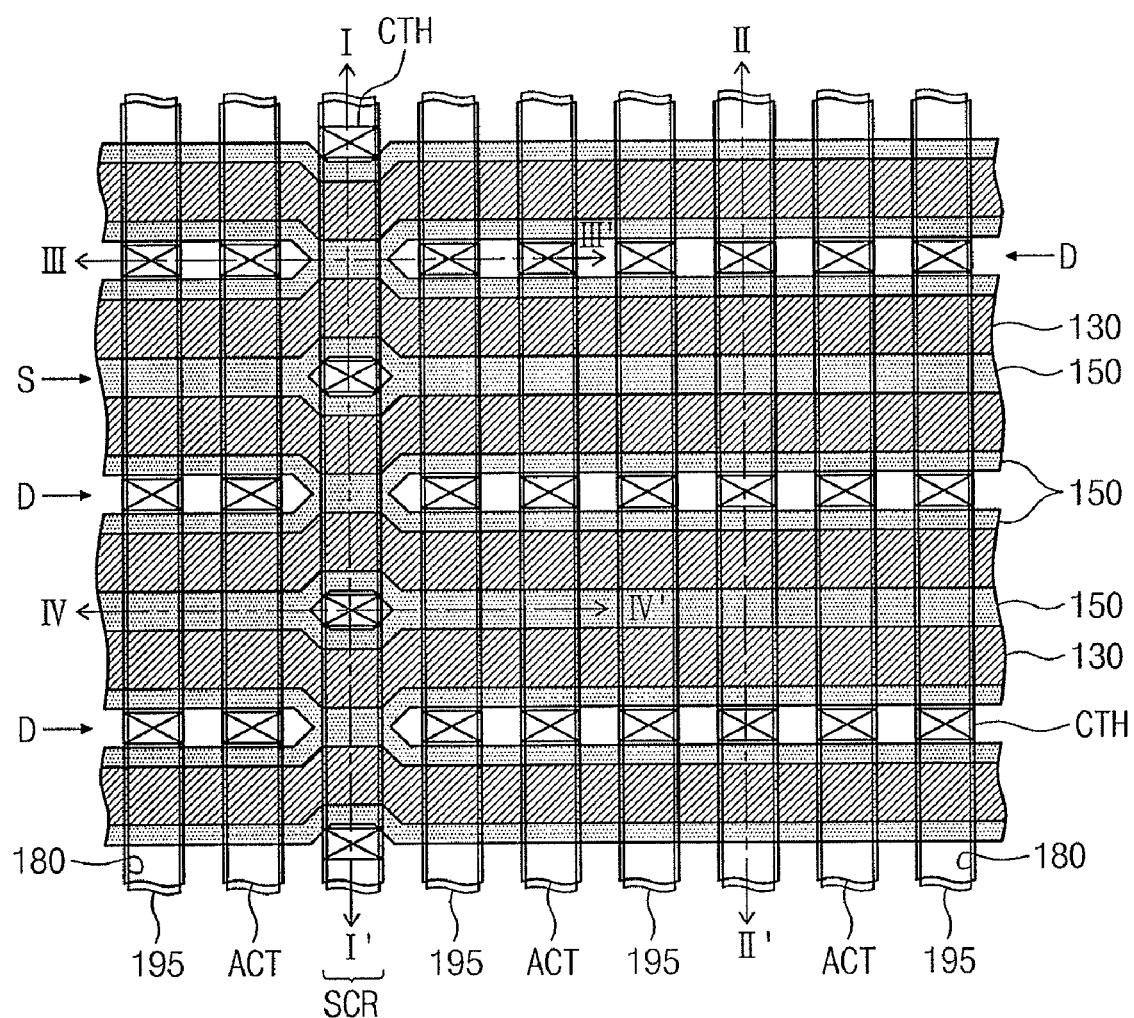
Figure 6B:
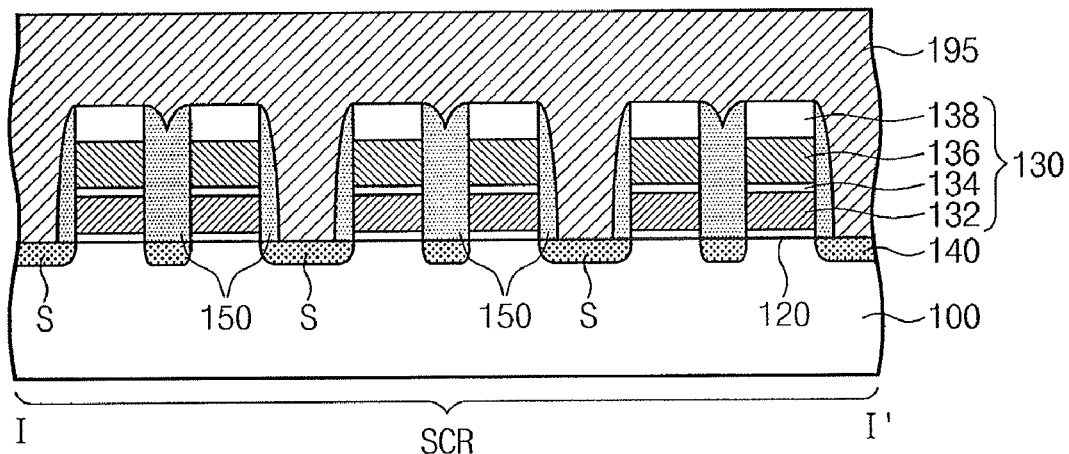
Figure 6C:
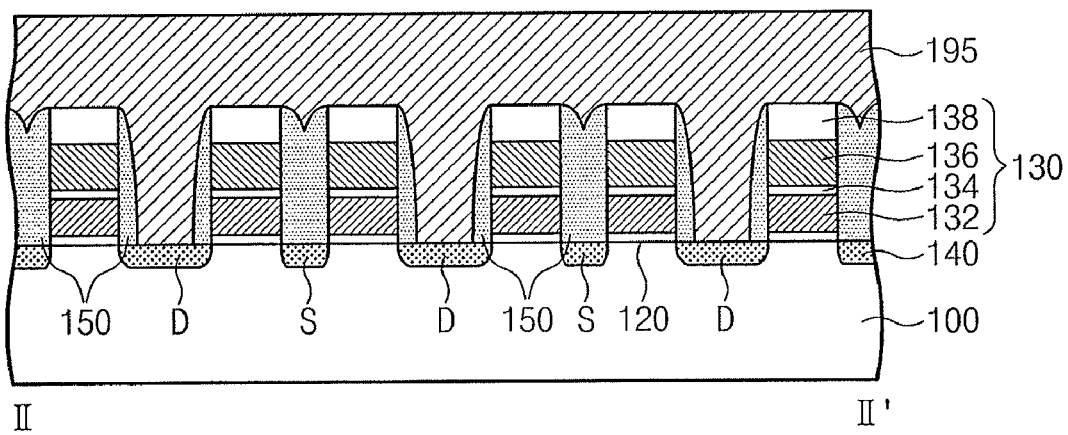
Figure 6D:
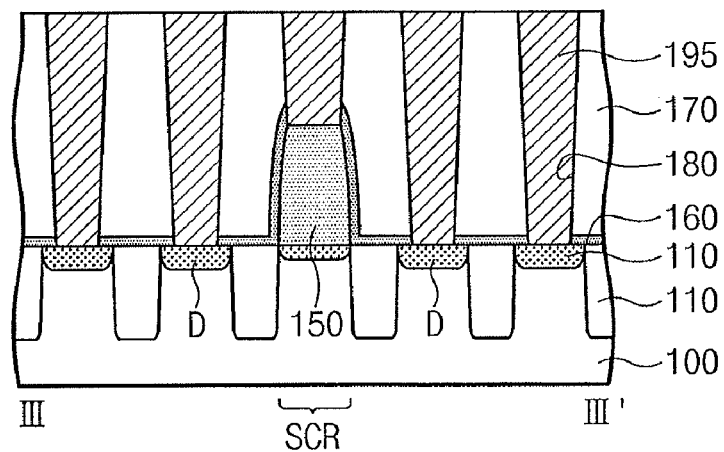
Figure 6E:
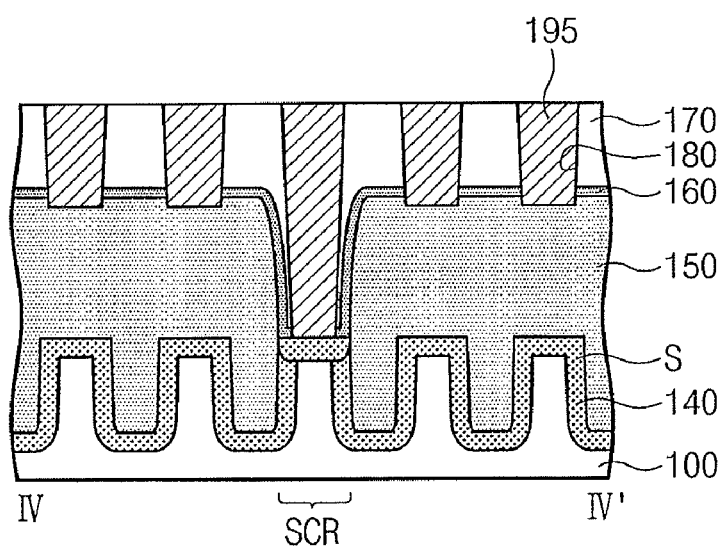
Figure 11:
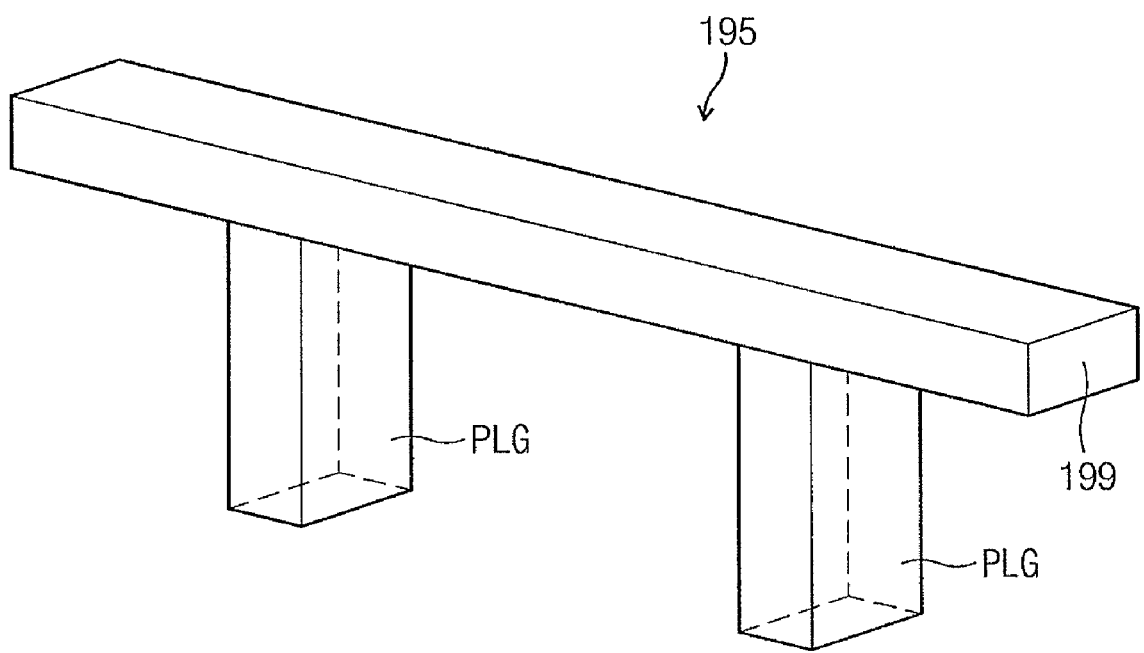
FIG. 11 illustrates a perspective view of a conductive pattern according to an example embodiment.

Referring to FIGS. 1 and 6A-6E, the first conductive layer 190 may be etched to expose an upper surface of the insulating interlayer 170 in operation S70. As a result, the first conductive layer 190 may become first conductive patterns 195 restricted in the openings 180. As illustrated in FIG. 11, the first conductive pattern 195 may include a linear portion 199 and at least one vertical portion PLG. For example, each first conductive pattern 195 may completely fill a corresponding opening 180, so an upper surface of the first conductive pattern 195 may be substantially coplanar with an upper surface of the insulating interlayer 170 defining sidewalls of the corresponding opening 180, as illustrated in FIG. 6D. Accordingly, each first conductive patterns 195 may be electrically separated, i.e., independent, from an adjacent first conductive pattern 195 along the first direction, i.e., along the x-axis. Etching of the first conductive layer 190 may include planarizing the first conductive layer 190 to expose an upper surface of the insulating interlayer 170. The planarization may be performed using, e.g., a CMP process or an etch-back process.

Since each first conductive patterns 195 may include a plurality of vertical portion PLG in respective contact holes CTH, the vertical portions PLG may be connected to each other along the second direction, i.e., along the y-axis, via the linear portion 199. In other words, as illustrated in FIG. 6C, the linear portion 199 of the first conductive patterns 195 (of FIG. 11) may correspond to the linear continuous structure along the second direction, and the portion PLG (of FIG. 11) may correspond to the vertical portion extending from the linear structure to fill each of the spaces between facing spacer patterns 150 along the second direction.

As described previously, the openings 180 may have a linear shape when viewed from a top plan view, i.e., rectangular cross section in the xy-plane, and may selectively expose upper surfaces of the impurity regions 140 in the wide gap region WGR, the first conductive patterns 195 may function both as interconnections for transferring electrical signals to the impurity regions 140, i.e., source lines and bit lines, and as contact plug electrically connecting the interconnections and the impurity regions 140. In other words, the first conductive patterns 195 may function as independent connections of drain electrodes D along the second direction, i.e., along the x-axis, and may be connected along the first direction, i.e., along the y-axis, via the linear structure 199 to function as source and bit lines intersecting the gate patterns 130.

In addition, since the opening 180 may be formed to have a line shape, a cross-section of the portion PLG in a plane parallel to the semiconductor substrate 100, i.e., in the xy-plane, may have a rectangular shape. More specifically, since each contact hole CTH may have two facing sidewalls defined by facing spacer patterns 150 along the first direction and two facing sidewalls defined by the line-shaped openings 180, i.e., defined by the insulating interlayer 170, along the second direction crossing the first direction, the space defined for each contact hole CTH by the sidewalls may have a rectangular shape. Accordingly, portion PLG used as the contact plug and positioned in the contact hole CTH may have a rectangular cross-section corresponding to the rectangular shape of the contact hole CTH. Thus, cross section of the contact hole CTH and the corresponding portion PLG may be controlled to have predetermined shape and size, so a reduction of size or a change of shape, e.g., rounding, may be eliminated or substantially minimized. For example, reduced size or shape due to an optical proximity effect during conventional patterning techniques may be substantially reduced or prevented. Further, since the portion PLG used as the contact plug may be formed through the same process as the first interconnection pattern 195, e.g., simultaneously, the portion PLG and the interconnection pattern 195 may be formed of a substantially same material.

FIGS. 7A-7D illustrate cross-sectional views of a stage in a method of forming a semiconductor device according to another example embodiment. FIGS. 7A-7D correspond to cross sectional views along lines I-I', II-II', III-III' and IV-IV' of FIG. 6A, respectively. Operations S10-S60 described previously with reference to FIGS. 2A-5E may be performed to form the line shaped openings 180, and common manufacturing stages and features will not be repeated.

Next, referring to FIGS. 7A-7D, the first conductive layer 190 may be etched to form first conductive patterns 192 in the openings 180. Upper surfaces of the first conductive patterns 192 may be vertically lower than upper surfaces of the insulating interlayer 170, i.e., the upper surfaces of the first conductive patterns 192 may be closer to the semiconductor substrate 100 along the y-axis than upper surfaces of the insulating interlayer 170. Thus, an upper sidewall of the opening 180 may be exposed after forming the first conductive patterns 192, e.g., an upper portion of the first conductive pattern 192 may be removed from the opening 180. Next, a second conductive layer (not shown) may be formed on the first conductive patterns 192 to fill the openings 180. The second conductive layer may be etched to expose an upper surface of the insulating interlayer 170 and form second conductive patterns 194 on the first conductive pattern 192 in the upper portion of the opening 180. The first and second conductive patterns 192 and 194 may contact each other.

Figure 7A:
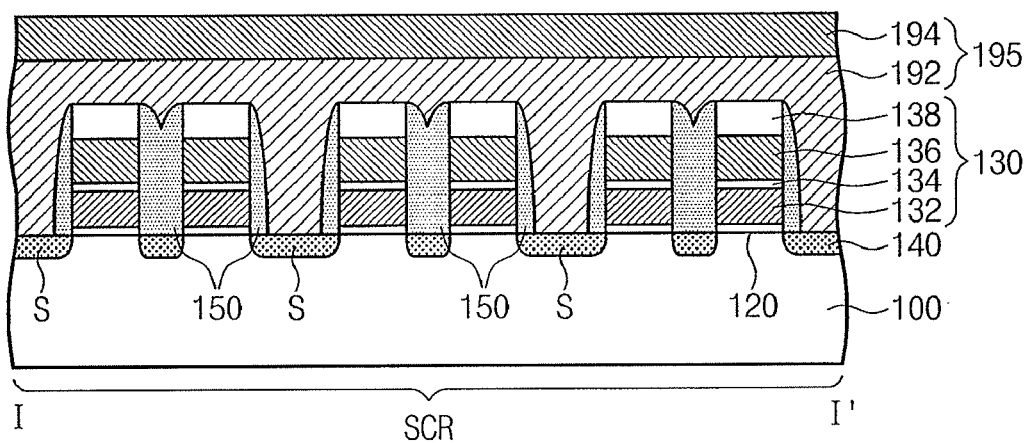
FIGS. 7A-7D illustrate cross sectional views in a method of forming a semiconductor device according to another example embodiment.
Figure 7B:
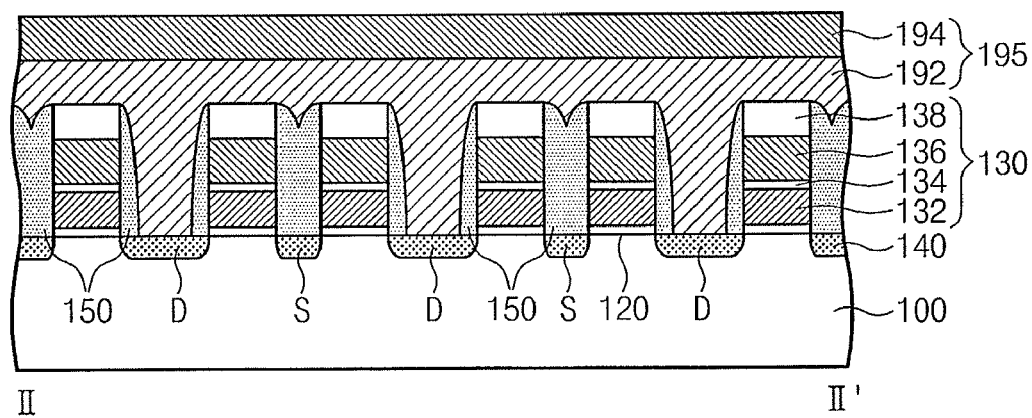
Figure 7C:
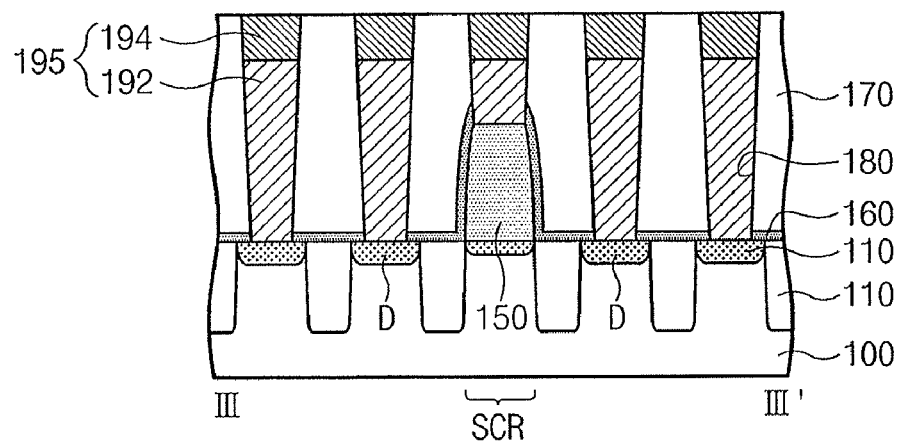
Figure 7D:
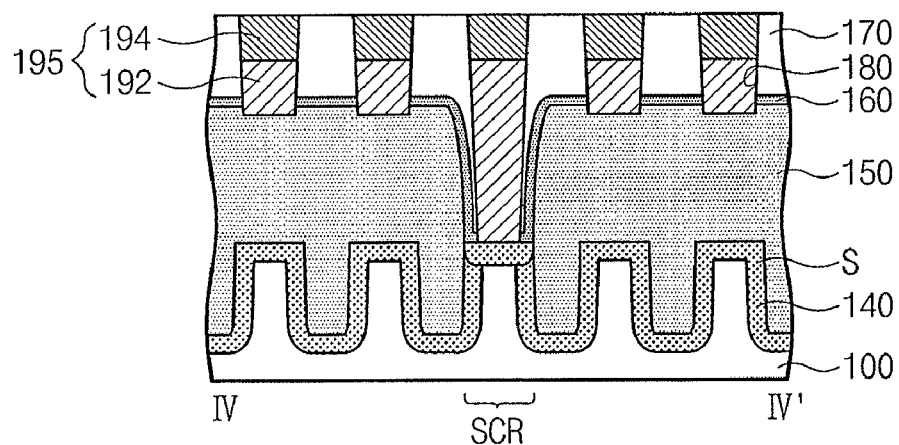

For example, each second conductive pattern 194 may completely fill a corresponding opening 180, so an upper surface of the second conductive pattern 192 may be substantially coplanar with an upper surface of the insulating interlayer 170 defining sidewalls of the corresponding opening 180, as illustrated in FIG. 7D. Accordingly, each second conductive pattern 192 may be electrically separated, i.e., independent, from an adjacent second conductive pattern 192 along the second direction, i.e., along the x-axis, and may be connected to an adjacent second conductive pattern 192 along the first direction, i.e., along the y-axis. Accordingly, the example embodiment described with reference to FIGS. 7A-7D may have the substantially same advantages described previously with reference to FIGS. 2A-6E.

The second conductive pattern 194 may be formed of a material having a lower resistivity than that of the first conductive pattern 192. The second conductive pattern 194 may be formed of, e.g., one or more of aluminum and copper, and may further include, e.g., one or more of titanium, titanium nitride, tantalum, and tantalum nitride, so the second conductive pattern 194 may have a barrier metal layer.

FIGS. 8A-8D illustrate cross-sectional views of a stage in a method of forming a semiconductor device according to another example embodiment. FIGS. 8A-8D correspond to cross sectional views along lines I-I', II-II', III-III' and IV-IV' of FIG. 6A, respectively. Operations S10-S60 described previously with reference to FIGS. 2A-5E may be performed to form the line shaped openings 180, and common manufacturing stages and features will not be repeated.

Next, referring to FIGS. 8A-8D, the first conductive layer 190 may be etched to form the first conductive patterns 192 in the openings 180. Upper surfaces of the first conductive patterns 192 may be substantially coplanar with the upper surfaces of the insulating interlayer 170. Next, a second conductive layer (not shown) may be formed on the first conductive patterns 192. The second conductive layer may be patterned to form second conductive patterns 196 on the first conductive patterns 192, so the first and second conductive patterns 192 and 196 may contact each other.

Figure 8A:
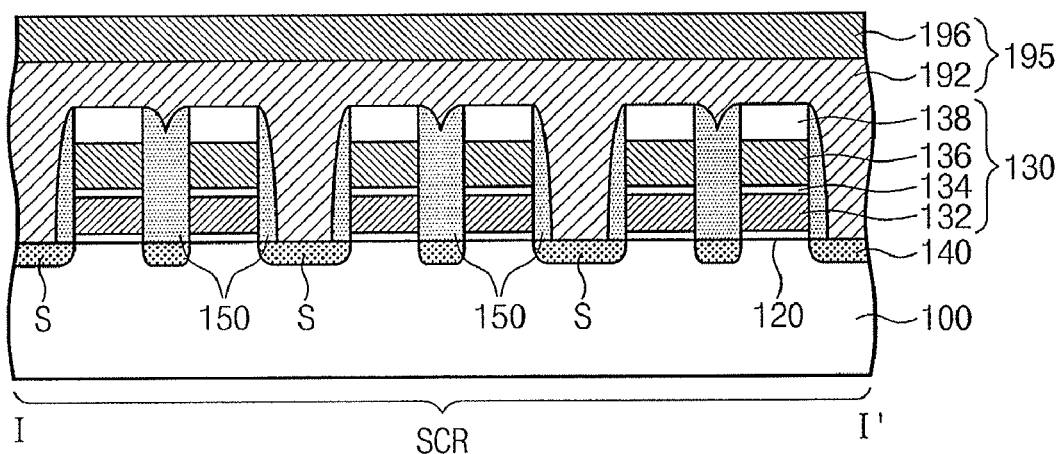
FIGS. 8A-8D illustrate cross sectional views in a method of forming a semiconductor device according to another example embodiment.
Figure 8B:
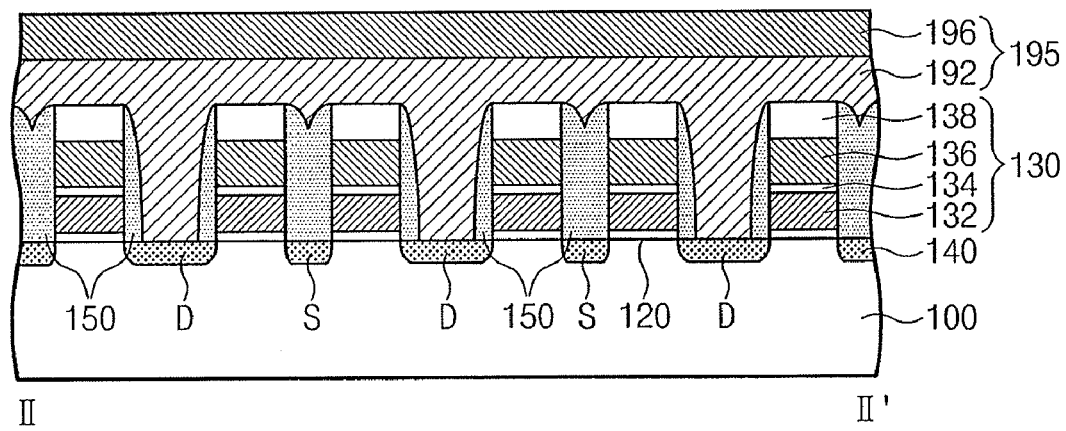
Figure 8C:
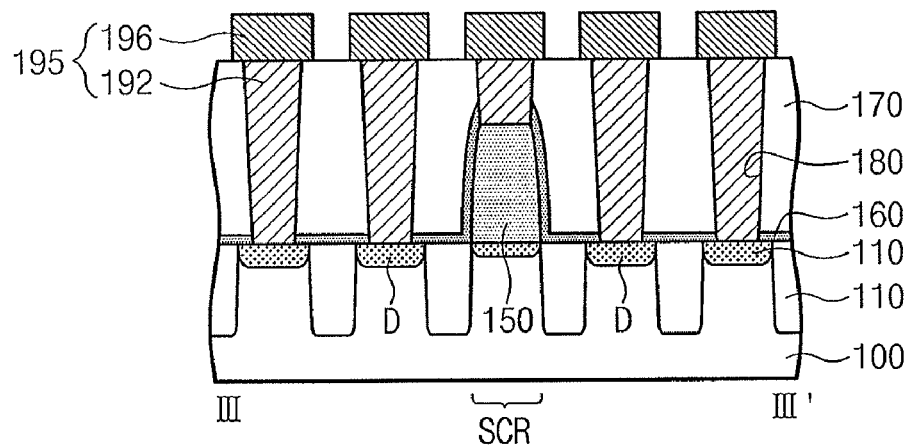
Figure 8D:
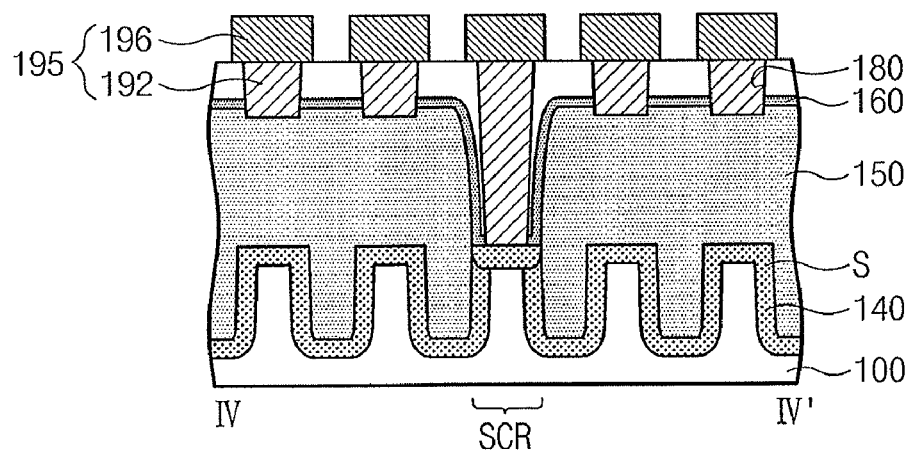
Figure 9A:
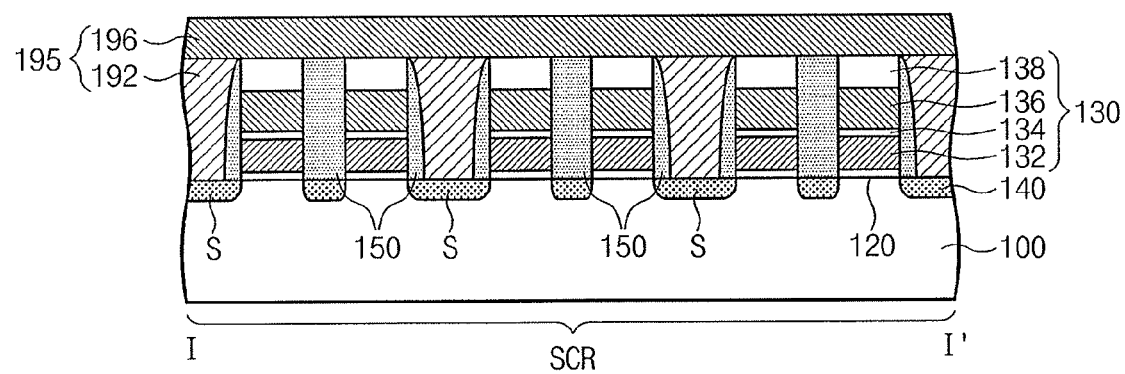
FIGS. 9A-9D illustrate cross sectional views in a method of forming a semiconductor device according to another example embodiment.
Figure 9B:
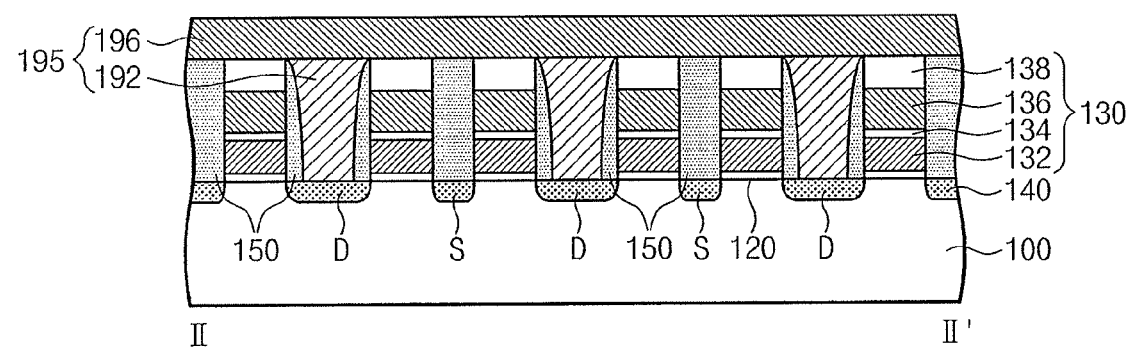
Figure 9C:
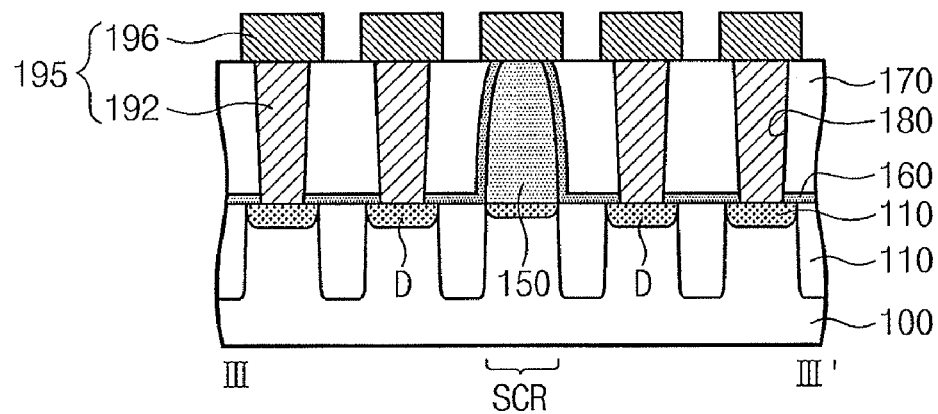
Figure 9D:
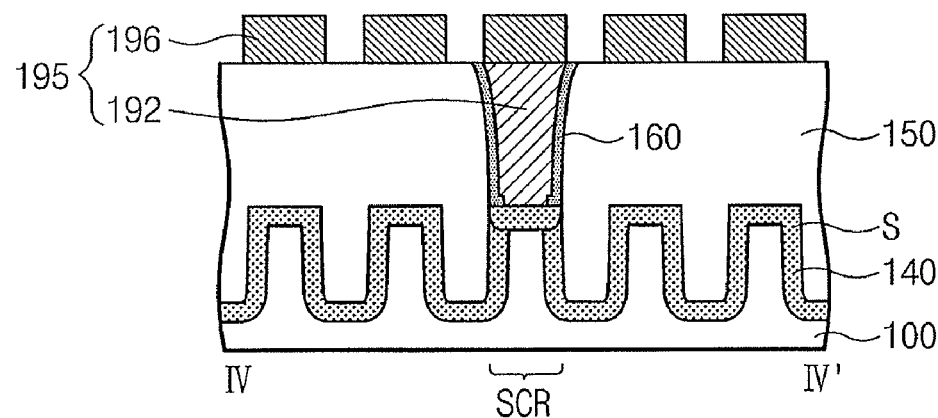
Figure 10A:
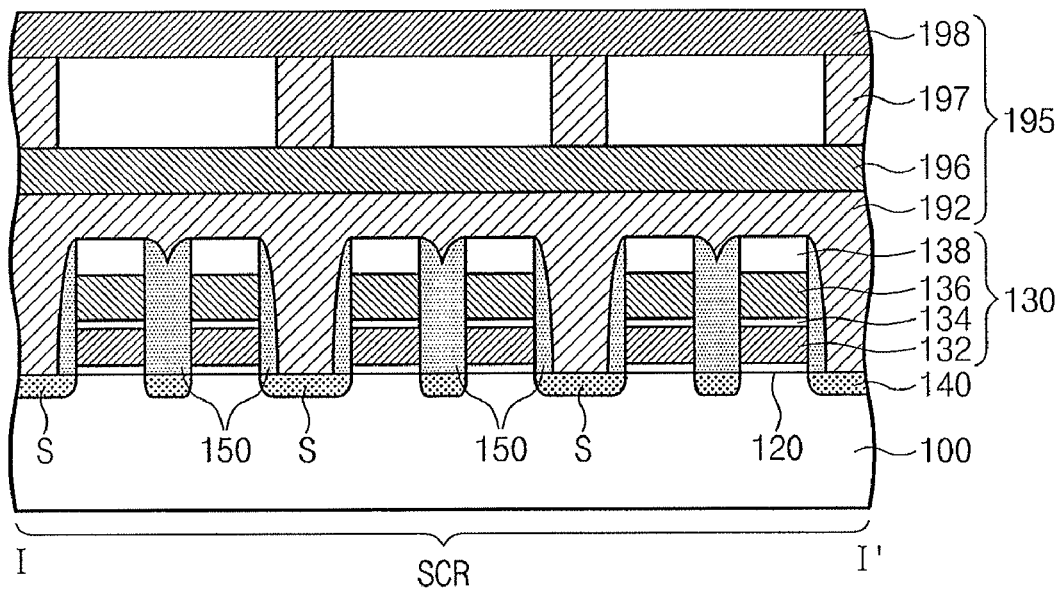
FIGS. 10A-10D illustrate cross sectional views in a method of forming a semiconductor device according to another example embodiment.
Figure 10B:
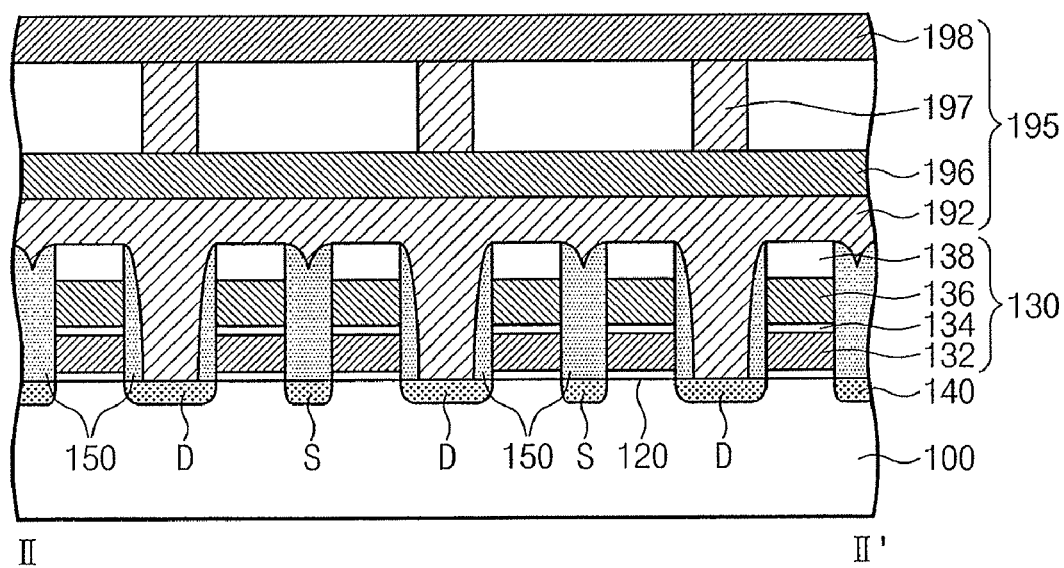
Figure 10C:
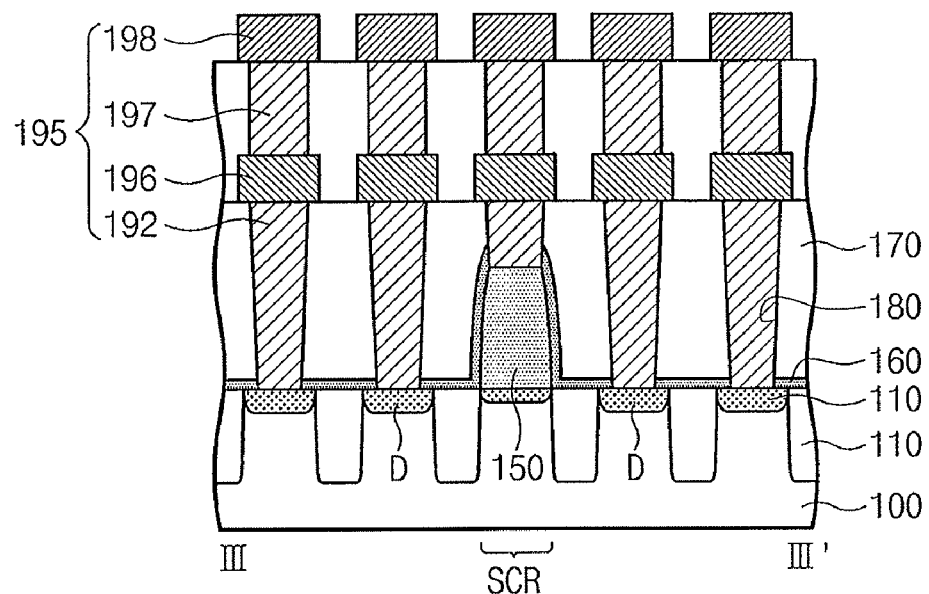
Figure 10D:
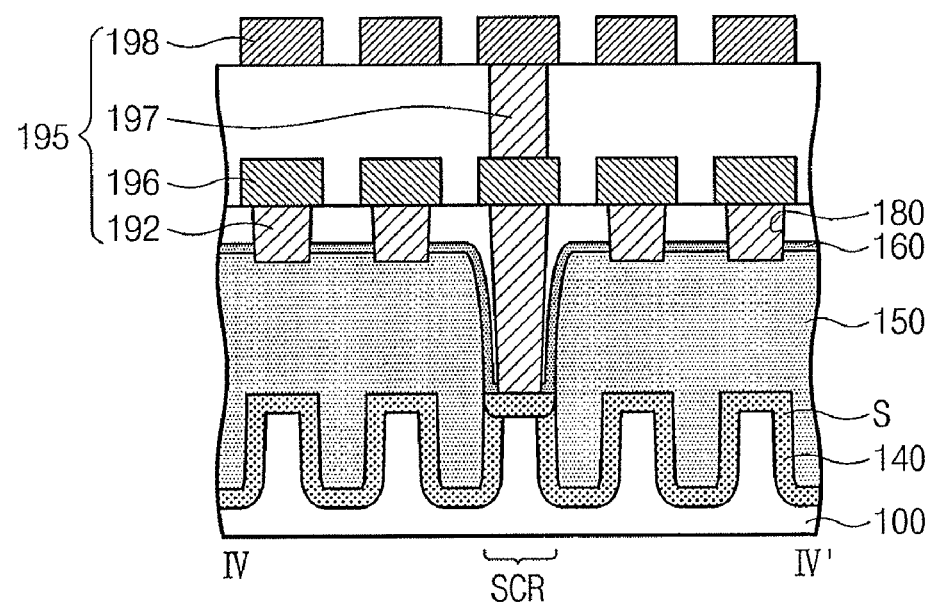

As illustrated in FIG. 8C, the second conductive pattern 196 may be wider than the first conductive pattern 192 along the second direction, e.g., along the x-axis, so the second conductive pattern 196 may contact a portion of the upper surface of the insulating interlayer 170. Each second conductive patterns 192 may be electrically separated, i.e., independent, from an adjacent second conductive pattern 192 along the second direction, i.e., along the x-axis, and may be connected to an adjacent second conductive pattern 192 along the first direction, i.e., along the y-axis. Accordingly, the example embodiment described with reference to FIGS. 8A-8D may have the substantially same advantages described previously with reference to FIGS. 2A-6E. Further, a difficulty of filling the opening 180 due to a high aspect ratio of the opening 180 may be reduced.

FIGS. 9A-9D illustrate cross-sectional views of a stage in a method of forming a semiconductor device according to another example embodiment. FIGS. 9A-9D correspond to cross sectional views along lines I-I', II-II', III-III' and IV-IV' of FIG. 6A, respectively. Operations S10-S60 described previously with reference to FIGS. 2A-5E may be performed to form the line shaped openings 180, and common manufacturing stages and features will not be repeated.

Next, referring to FIGS. 9A-9D, the first conductive layer 190 may be etched to form the first conductive patterns 192 in the openings 180. A depth of the opening 180 along the vertical direction may substantially equal a depth of the gate pattern 130, so upper surfaces of the first conductive patterns 192 may be substantially coplanar with the upper surfaces of the insulating interlayer 170 and with the upper surfaces of the gate patterns 130. Accordingly, the first conductive patterns 192 may not form interconnections crossing the gate patterns 130, and may only function as independent contact plug connected to the impurity regions 140.

Next, a second conductive layer (not shown) may be formed on the first conductive patterns 192. The second conductive layer may be patterned to form second conductive patterns 196 on the first conductive patterns 192, so the first and second conductive patterns 192 and 196 may contact each other. As illustrated in FIG. 8C, the second conductive pattern 196 may be wider than the first conductive pattern 192 along the second direction, e.g., along the x-axis, so the second conductive pattern 196 may contact a portion of the upper surface of the insulating interlayer 170.

The second conductive patterns 196 may be formed to electrically connect the first conductive patterns 192 along the first direction, i.e., along the y-axis. In particular, each second conductive pattern 192 may be electrically separated, i.e., independent, from an adjacent second conductive pattern 192 along the second direction, i.e., along the x-axis, and may be connected to an adjacent second conductive pattern 192 along the first direction, i.e., along the y-axis. Accordingly, the example embodiment described with reference to FIGS. 9A-9D may have the substantially same advantages described previously with reference to FIGS. 2A-6E.

FIGS. 10A-10D illustrate cross-sectional views of a stage in a method of forming a semiconductor device according to another example embodiment. FIGS. 10A-10D correspond to cross sectional views along lines I-I', II-II', III-III' and IV-IV' of FIG. 6A, respectively. Operations S10-S60 described previously with reference to FIGS. 2A-5E may be performed to form the line shaped openings 180, and common manufacturing stages and features will not be repeated.

Next, referring to FIGS. 10A-10D, the first conductive layer 190 may be etched to form the first and second conductive patterns 192 and 196, as described previously with reference to FIGS. 8A-8D. Next, via plugs 197 may be formed on the second conductive patterns 196. Third conductive patterns 198 may be formed on the via plugs 1907 to be connected to the second conductive patterns 196 through the via plugs 197. The third conductive patterns 198 may be formed on the second conductive pattern 196 or on an upper portion of the active region ACT. It is noted that the via plugs 197 and the third conductive patterns 198 may be formed in any of the example embodiments described with reference to FIGS. 1-9D, and the third conductive patterns 198 may be connected to the first conductive pattern 192 or the second conductive pattern 194 or 196.

Exemplary embodiments of the present invention have been disclosed herein, and although specific terms may be employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:

line patterns on a substrate along a first direction, the line patterns defining narrow gap regions along the first direction and wide gap regions along the first direction, the substrate being a semiconductor substrate with device isolation layers defining an active region, the active region extending in a second direction and crossing the line patterns, narrow gap regions and wide gap regions;

spacer patterns in the narrow and wide gap regions on sidewalls of the line patterns, spacer patterns facing one another in the wide gap regions being spaced apart from each other to expose an upper surface of the substrate, and spacer patterns facing one another in the narrow gap regions contacting each other to fill the narrow gap regions;

an insulating interlayer covering the spacer patterns and the line patterns;

at least one opening along the second direction through the insulating interlayer, the at least one opening having a continuous line shape along the second direction, the second direction being perpendicular to the first direction, and the at least one opening selectively exposing the line patterns and spacer patterns and including at least one contact hole selectively exposing the upper surface of the substrate in one of the wide gap regions; and a conductive pattern in the at least one opening and the at least one contact hole to define an interconnection pattern on a contact plug, wherein the spacer patterns in the narrow gap regions are interposed between and directly contact the interconnection pattern and the active region, the spacer patterns electrically separating the interconnection pattern and the active region from each other in the narrow gap regions.

2. The semiconductor device as claimed in claim 1, wherein the interconnection pattern and the contact plug are integral to each other.

3. The semiconductor device as claimed in claim 1, wherein:

the line patterns are gate patterns defining source and drain regions in the narrow and wide gap regions, and each of the gate patterns is a gate structure of a non volatile memory transistor including a floating gate electrode, a gate insulating interlayer pattern and a control gate electrode, which are sequentially stacked.

4. The semiconductor device as claimed in claim 1, wherein a cross section of the contact plug in a plane parallel to a contact plane between the line patterns and the substrate has a rectangular shape.

5. The semiconductor device as claimed in claim 1, wherein the at least one opening has a continuous line shape along the second direction.

6. The semiconductor device as claimed in claim 1, wherein the spacer patterns are of a material having an etching selectivity with respect to the insulating interlayer.

7. The semiconductor device as claimed in claim 1, wherein the insulating interlayer includes a silicon oxide layer, and the spacer patterns include a silicon nitride layer or a silicon oxynitride layer.

8. The semiconductor device as claimed in claim 1, wherein the second direction intersects the first direction, the at least one contact hole is in a source contact region extending along the first direction, and source regions in the source contact region are covered by the spacer patterns in the narrow gap regions and are exposed by the at least one contact hole in the wide gap region.

* * * * *